(12) United States Patent
Xi et al.

(10) Patent No.: US 11,257,765 B2
(45) Date of Patent: Feb. 22, 2022

(54) CHIP PACKAGE STRUCTURE INCLUDING CONNECTING POSTS AND CHIP PACKAGE METHOD

(71) Applicant: Shanghai AVIC OPTO Electronics Co., Ltd., Shanghai (CN)

(72) Inventors: Kerui Xi, Shanghai (CN); Feng Qin, Shanghai (CN); Jine Liu, Shanghai (CN); Xiaohe Li, Shanghai (CN); Tingting Cui, Shanghai (CN); Yuan Ding, Shanghai (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/441,501

(22) Filed: Jun. 14, 2019

(65) Prior Publication Data
US 2020/0312772 A1 Oct. 1, 2020

(30) Foreign Application Priority Data
Mar. 29, 2019 (CN) .......................... 201910251627.7

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC . H01L 24/20; H01L 23/5389; H01L 21/4853; H01L 21/4857; H01L 21/565;
(Continued)

(56) References Cited

U.S. PATENT DOCUMENTS 9,691,743 B2 * 6/2017 Magnus .................. H01L 21/56
9,825,007 B1 * 11/2017 Chen .................. H01L 23/3135
(Continued)

FOREIGN PATENT DOCUMENTS

CN 106558574 A 4/2017
CN 107068669 A 8/2017
(Continued)

*Primary Examiner* — John P. Dulka
(74) *Attorney, Agent, or Firm* — Anova Law Group, PLLC

(57) ABSTRACT

Chip package structure and chip package method are provided. The chip package structure includes an encapsulating layer, a redistribution layer, a soldering pad group, and bare chips. Connecting posts is formed on a side of the bare chips. The encapsulating layer covers the bare chips and the connecting posts, while exposes a side of the connecting posts away from the bare chips. The redistribution layer on the connecting posts includes a first redistribution wire, a second redistribution wire, and a third redistribution wire. The first redistribution wire and the second redistribution wire are electrically connected to at least one connecting post respectively, and the third redistribution layer is electrically connected to remaining connecting posts. The soldering pad group on the redistribution layer includes an input soldering pad electrically connected to the first redistribution wire and an output soldering pad electrically connected to the second redistribution wire.

19 Claims, 21 Drawing Sheets

(51) Int. Cl.
*H01L 21/56* (2006.01)
*H01L 23/31* (2006.01)
*H01L 23/00* (2006.01)

(52) U.S. Cl.
CPC .......... *H01L 21/565* (2013.01); *H01L 21/568* (2013.01); *H01L 23/3121* (2013.01); *H01L 23/5383* (2013.01); *H01L 23/5386* (2013.01); *H01L 23/5387* (2013.01); *H01L 23/564* (2013.01); *H01L 24/18* (2013.01); *H01L 24/20* (2013.01); *H01L 2224/214* (2013.01); *H01L 2924/1904* (2013.01); *H01L 2924/19041* (2013.01); *H01L 2924/19042* (2013.01); *H01L 2924/19043* (2013.01); *H01L 2924/19103* (2013.01)

(58) Field of Classification Search
CPC ............... H01L 21/568; H01L 23/3121; H01L 23/5383; H01L 23/5386; H01L 23/5387; H01L 23/564; H01L 24/18
See application file for complete search history.

(56) References Cited

U.S. PATENT DOCUMENTS

| | | | | |
|---|---|---|---|---|
| 10,460,987 | B2* | 10/2019 | Liao | H01L 21/76837 |
| 10,854,551 | B2* | 12/2020 | Yu | H01L 23/49811 |
| 2004/0145051 | A1* | 7/2004 | Klein | H01L 25/0652 |
| | | | | 257/734 |
| 2006/0291029 | A1* | 12/2006 | Lin | H01L 23/5223 |
| | | | | 257/622 |
| 2007/0158787 | A1* | 7/2007 | Chanchani | H01L 21/6835 |
| | | | | 257/619 |
| 2008/0316714 | A1* | 12/2008 | Eichelberger | H01L 23/5389 |
| | | | | 361/728 |
| 2011/0147911 | A1* | 6/2011 | Kohl | H01L 25/105 |
| | | | | 257/686 |
| 2013/0154108 | A1* | 6/2013 | Lin | H05K 1/185 |
| | | | | 257/774 |
| 2013/0264684 | A1* | 10/2013 | Yu | H01L 21/561 |
| | | | | 257/616 |
| 2014/0015131 | A1* | 1/2014 | Meyer | H01L 21/561 |
| | | | | 257/738 |
| 2014/0312458 | A1* | 10/2014 | Ashrafzadeh | H01L 25/0652 |
| | | | | 257/531 |
| 2015/0194388 | A1* | 7/2015 | Pabst | H01L 23/3128 |
| | | | | 257/659 |
| 2015/0228632 | A1* | 8/2015 | Yu | H01L 24/18 |
| | | | | 257/704 |
| 2015/0235991 | A1* | 8/2015 | Gu | H01L 23/5226 |
| | | | | 257/762 |
| 2015/0292099 | A1* | 10/2015 | Ru | H01L 23/4857 |
| | | | | 174/251 |
| 2015/0325544 | A1* | 11/2015 | Wang | H01L 21/50 |
| | | | | 257/738 |
| 2017/0345761 | A1* | 11/2017 | Yu | H01L 21/565 |
| 2019/0312016 | A1* | 10/2019 | O'Sullivan | H01L 21/565 |
| 2019/0326255 | A1* | 10/2019 | Olson | H01L 24/05 |
| 2020/0091128 | A1* | 3/2020 | Elsherbini | H01L 23/5383 |
| 2020/0211980 | A1* | 7/2020 | Huang | H01L 23/5383 |
| 2020/0328159 | A1* | 10/2020 | Xi | H01L 21/4853 |
| 2020/0373243 | A1* | 11/2020 | Jang | H01L 23/49816 |
| 2021/0159160 | A1* | 5/2021 | Chen | H01L 23/49866 |

FOREIGN PATENT DOCUMENTS

| | | |
|---|---|---|
| CN | 105655310 B | 8/2018 |
| CN | 109216324 A | 1/2019 |

* cited by examiner

CHIP PACKAGE STRUCTURE INCLUDING CONNECTING POSTS AND CHIP PACKAGE METHOD

CROSS-REFERENCES TO RELATED APPLICATION

This application claims the priority of Chinese Patent Application No. 201910251627.7, filed on Mar. 29, 2019, the content of which is incorporated herein by reference in its entirety.

TECHNICAL FIELD

The present disclosure generally relates to the field of chip package technology and, more particularly, relates to a chip package structure and a chip package method.

BACKGROUND

As integrated circuit technologies develop, electronic products are continuously moving toward a direction of miniaturization, smart devices, and high reliability, posing an unprecedented challenge to an integration level of circuits in electronic products. In a present integration technology, chips formed by various processes are assembled together in a printed circuit board (PCB), and signals between the chips transmitted through printed wires in the PCB.

However, when assembling the chips, it is usually necessary to implant balls for the chip structure after being packaged, and then the chip structure is soldered to the PCB. The assembly process has a high cost and is very complex. Each implanted ball has to be soldered independently, and the process has a heavy workload. A connection between each implanted ball and the PCB has a poor reliability, and a good product ratio of the electronic products is low.

Also, the printed wires in the PCB for transmitting signals between the chips occupy a large space of the PCB. A miniaturization of electronic products is hard. When a quantity of the printed wire is large, a portion of the printed wires has a large length. A power consumption of electronic products is high.

SUMMARY

One aspect of the present disclosure provides a chip package structure. The structure includes: an encapsulating layer, a redistribution layer, a soldering pad group, and a plurality of bare chips. A plurality of connecting posts is formed on a side of the plurality of bare chips. The encapsulating layer covers the plurality of bare chips and the plurality of connecting posts, and exposes a side of the plurality of connecting posts away from the plurality of bare chips. The redistribution layer is disposed on the side of the plurality of connecting posts away from the plurality of bare chips, including a first redistribution wire, a second redistribution wire, and a third redistribution wire. The first redistribution wire and the second redistribution wire are electrically connected to at least one of the plurality of connecting posts respectively, and the third redistribution layer is electrically connected to a remaining portion of the plurality of connecting posts. The soldering pad group is disposed on a side of the redistribution layer away from the encapsulating layer, including an input soldering pad and an output soldering pad. The input soldering pad is electrically connected to the first redistribution wire, and the output soldering pad is electrically connected to the second redistribution wire; or the input soldering pad is electrically connected to the second redistribution wire, and the output soldering pad is electrically connected to the first redistribution wire.

Another aspect of the present disclosure provides a chip package method. The method includes: providing a base substrate; providing a plurality of bare chips attached to the base substrate and forming a plurality of connecting posts on a side of the plurality of bare chips; forming an encapsulating layer to cover the plurality of bare chips and the plurality of connecting posts; polishing the encapsulating layer to expose a side of the plurality of connecting posts away from the plurality of bare chips; forming a redistribution layer on the side of the plurality of connecting posts away from the plurality of bare chips; forming a soldering pad group on a side of the redistribution layer away from the encapsulating layer, including an input soldering pad and an output soldering pad; and lifting off the base substrate. The redistribution layer includes a first redistribution wire, a second redistribution wire, and a third redistribution wire. The first redistribution wire and the second redistribution wire are electrically connected to at least one of the plurality of connecting posts respectively, and the third redistribution layer is electrically connected to a remaining portion of the plurality of connecting posts. The input soldering pad is electrically connected to the first redistribution wire, and the output soldering pad is electrically connected to the second redistribution wire; or the input soldering pad is electrically connected to the second redistribution wire, and the output soldering pad is electrically connected to the first redistribution wire.

Another aspect of the present disclosure provides a chip package method. The method includes: providing a base substrate; forming a soldering pad group on the base substrate including an input soldering pad and an output soldering pad; forming a redistribution layer on a side of the soldering pad group away from the base substrate, including a first redistribution wire, a second redistribution wire, and a third redistribution wire; providing a plurality of bare chips and a plurality of connecting posts on a side of the plurality of bare chips; forming an encapsulating layer to cover the plurality of bare chips and the plurality of connecting posts; and lifting off the base substrate to expose a surface of the soldering pad group. The input soldering pad is electrically connected to the first redistribution wire, and the output soldering pad is electrically connected to the second redistribution wire; or the input soldering pad is electrically connected to the second redistribution wire, and the output soldering pad is electrically connected to the first redistribution wire. The first redistribution wire and the second redistribution wire are electrically connected to at least one of the plurality of connecting posts respectively, and the third redistribution layer is electrically connected to a remaining portion of the plurality of connecting posts Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
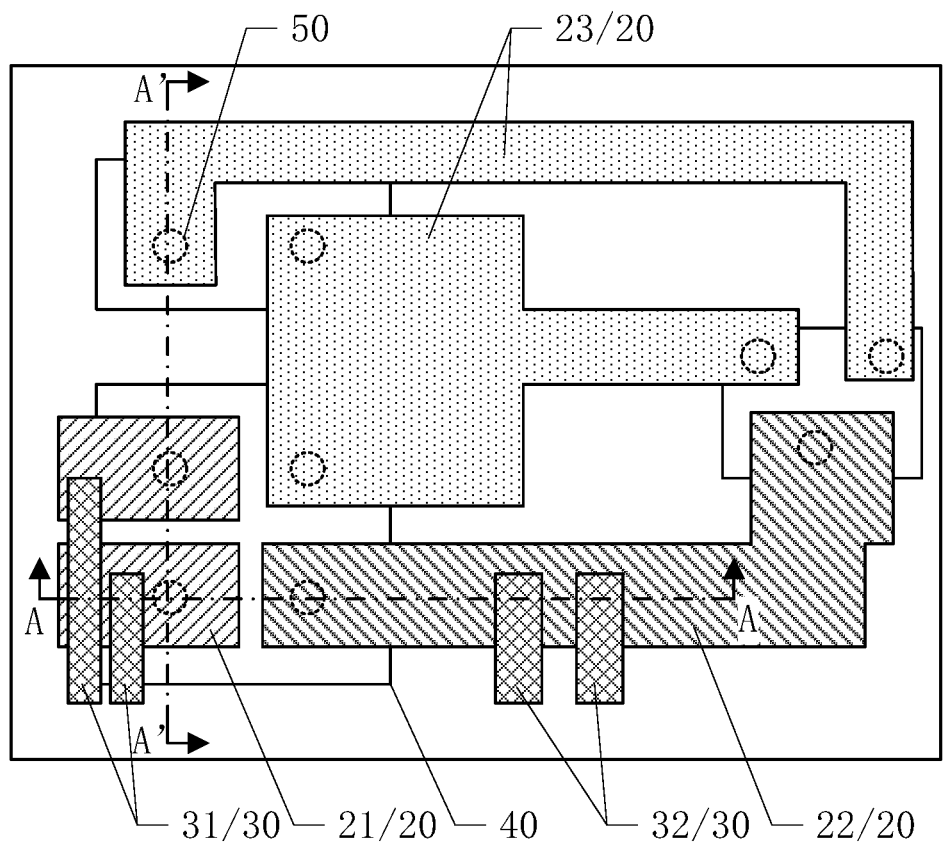
FIG. 1 illustrates a planar structure of an exemplary chip package structure consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

The present disclosure provides a chip package structure. In one embodiment illustrated in FIGS. 1-2, the chip package structure may include an encapsulating layer 10, a redistribution layer 20, a soldering pad group 30, and a plurality of bare chips 40, A plurality of connecting posts 50 may be formed on a side of the plurality of bare chips 40. The encapsulating layer 10 may cover the plurality of bare chips 40 and the plurality of connecting posts 50, but expose a side of the plurality of connecting posts 50 away from the plurality of bare chips 40. The redistribution layer 20 may be disposed on the side of the plurality of connecting posts 50 away from the plurality of bare chips 40. The redistribution layer 20 may include a first redistribution wire 21, a second redistribution wire 22, and a third redistribution wire 23. The first redistribution wire 21 may be electrically connected to at least one of the plurality of connecting posts 50, and the second redistribution wire 22 may be electrically connected to at least one of the plurality of connecting posts SO. The third redistribution wire 23 may be electrically connected to a remaining portion of the plurality of connecting posts 50.

The soldering pad group 30 may be disposed on a side of the redistribution layer 20 away from the encapsulating layer 10. The soldering pad group 30 may include an input soldering pad 31 and an output soldering pad 32. The input soldering pad 31 may be electrically connected the first redistribution wire 21, and the output soldering pad 32 may be electrically connected to the second redistribution wire 22. In other embodiments, the input soldering pad 31 may be electrically connected the second redistribution wire 22, and the output soldering pad 32 may be electrically connected to the first redistribution wire 21.

In one embodiment, the plurality of bare chips 40 may include integrated circuits. The plurality of connecting posts 50 may be disposed on a side of the plurality of bare chips 40. External signals may be transmitted to the integrated circuits of the plurality of bare chips 40 through the plurality of connecting posts 50 and signals in the integrated circuits of the plurality of bare chips 40 may be transmitted outside through the plurality of connecting posts 50. The plurality of connecting posts 50 may be made of materials with a good electrical conductivity including copper, silver, gold, and/or nickel, to make the plurality of connecting posts 50 have a good electrical connection. In some other embodiments, the plurality of connecting posts 50 may have a block soldering pad structure.

A number of the plurality of bare chips 40 may be configured according to actual needs. For description purposes only, the embodiment in FIG. 1 with three bare chips 40 is used as an example to illustrate the present disclosure and should not limit the scopes of the present disclosure. In various embodiments, the number of the plurality of bare chips 40 in the chip package structure may be two or more. A model and a function of each of the plurality of bare chips 40 may be configured according to actual needs and the chip package structure in the present disclosure is not limited to the plurality of bare chips 40 with a same model and same functions.

The plurality of bare chips 40 and the plurality of connecting posts 50 may be covered by the encapsulating layer 10. The encapsulating layer 10 may be made of a material including epoxy molding compound (EMC). EMC may be a powder molding compound formed by mixing epoxy resin as a matrix resin, high-performance phenolic resin as a curing agent, fillers including silicon micropowder, and other additives. EMC may have a good sealing performance and a plasticity, and then may seal and protect the plurality of bare chips 40 and the plurality of connecting posts 50. In one embodiment, a side surface of the plurality of bare chips 40 away from the plurality of connecting posts 50 may be completely covered by the encapsulating layer 10. In some other embodiments, the side surface of the plurality of bare chips 40 without the plurality of connecting posts 50 may be partially covered or may not be covered by the encapsulating layer 10. For description purposes only, the embodiment in FIG. 2 where the side surface of the plurality of bare chips 40 away from the plurality of connecting posts 50 is not covered by the encapsulating layer 10 is used as an example to illustrate the present disclosure and should not limit the scopes of the present disclosure.

The redistribution layer 20 may enlarge leads of the plurality of connecting posts 50 one level by one level, to achieve a fan-out package for the plurality of bare chips 40. In one embodiment, the redistribution layer 20 may be disposed on a side of the plurality of connecting posts 50 away from the plurality of bare chips 40. The redistribution layer 20 may include the first redistribution wire 21, the second redistribution wire 22, and the third redistribution wire 23. A number of each of redistribution wires may be configured according to actual needs and the present disclosure has no limit on it. The first redistribution wire 21 may be electrically connected to at least one of the plurality of connecting posts 50, and the second redistribution wire 22 may be electrically connected to at least one of the plurality of connecting posts 50. The input soldering pad 31 may be electrically connected the first redistribution wire 21, and the output soldering pad 32 may be electrically connected to the second redistribution wire 22. External signals may be transmitted to the integrated circuits of the plurality of bare chips 40 through the input soldering pad 31, and signals in the integrated circuits of the plurality of bare chips 40 may be transmitted outside through the output soldering pad 32 electrically connected to the plurality of connecting posts 50. In some other embodiments, the input soldering pad 31 may be electrically connected the second redistribution wire 22, and the output soldering pad 32 may be electrically connected to the first redistribution wire 21, The connection between the soldering pad group 30 and the plurality of connecting posts 50 may be configured according to actual needs and the present disclosure has no limit on this.

The third redistribution wire 23 of the redistribution layer 20 may be electrically connected to a remaining portion of the plurality of connecting posts 50. Correspondingly, except for a portion of the plurality of connecting posts 50 for inputting and outputting signals, a remaining portion of the plurality of connecting posts 50 may be wired directly through the third redistribution wire 23, to achieve an electrical connection between different bare chips of the plurality of bare chips 40. A wiring out through the soldering pad group 30 may be avoided. Correspondingly, an independent package of each of the plurality of bare chips and a subsequent assembly between the plurality of bare chips and the PCB may be achieved through a single chip package structure. An integration level of the chip package structure may be improved to meet a miniaturization of electronic products. A product efficiency may be improved. The present disclosure also may have a lower cost than the current technology where each chip is packaged independently and then is soldering to the PCB. Since a ball implantation process may be avoided, the present disclosure is more convenient, and the chip package structure may have high reliability. A good product ratio of electronic products may be improved. A wiring distance in the chip package structure where the plurality of bare chips is packaged together may be reduced effectively. A power consumption of the electric products may be reduced then.

Figure 2:
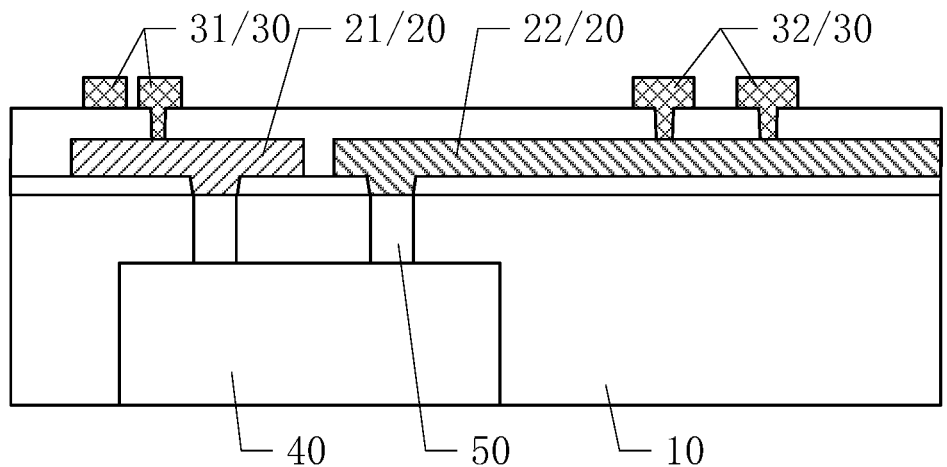
FIG. 2 illustrates a cross-section view of the chip package structure in FIG. 1 along an A-A direction consistent with various disclosed embodiments in the present disclosure.
Figure 3:
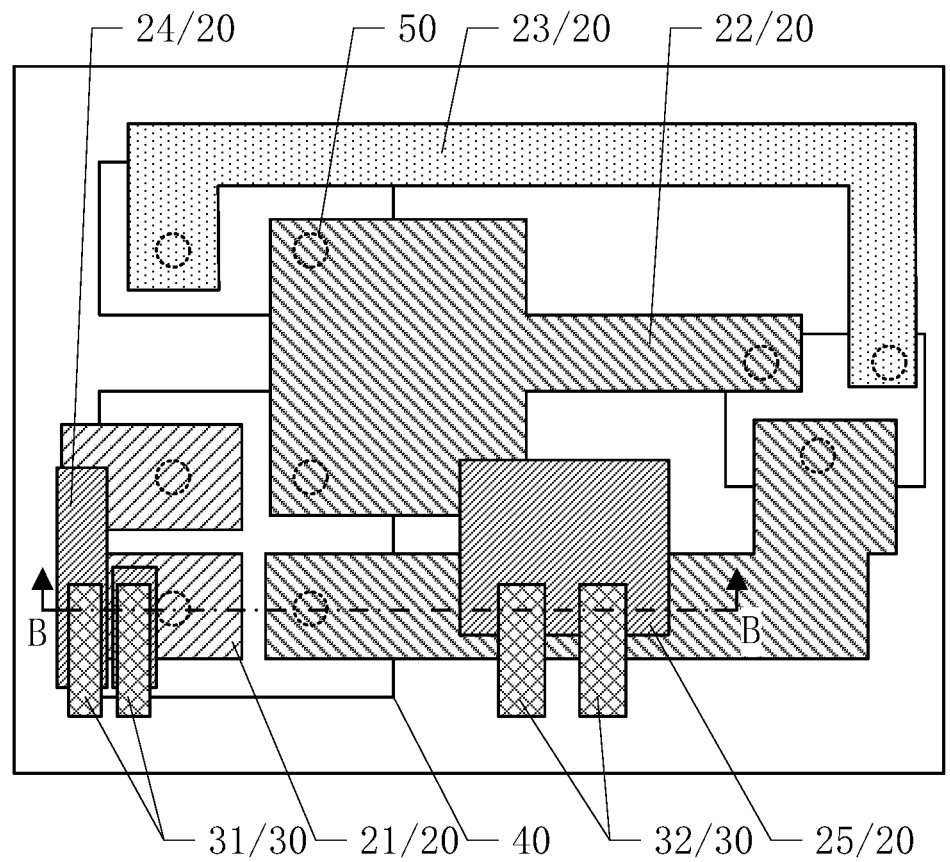
FIG. 3 illustrates a planar structure of another exemplary chip package structure consistent with various disclosed embodiments in the present disclosure.
Figure 4:
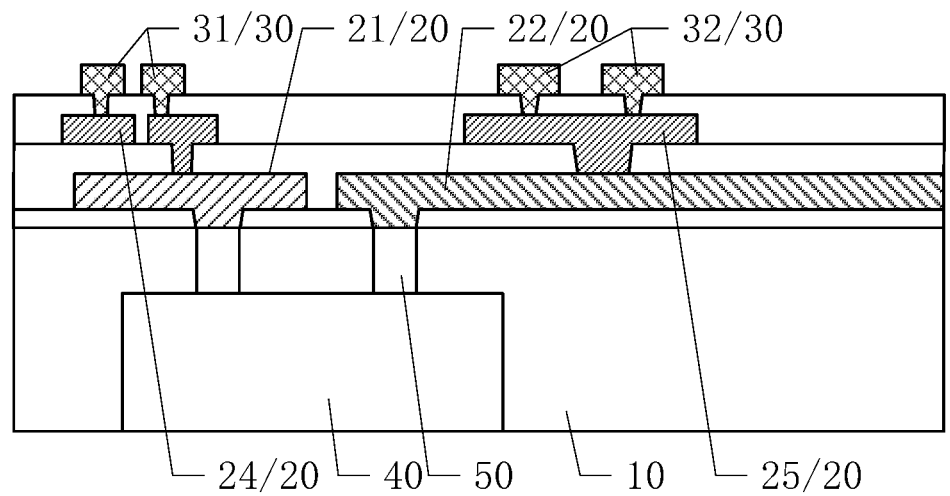
FIG. 4 illustrates a cross-section view of the chip package structure in FIG. 3 along a C-C direction consistent with various disclosed embodiments in the present disclosure.

In one embodiment illustrated in FIGS. 1-2, the redistribution layer 20 may be a single layer structure. In some other embodiments illustrated in FIGS. 3-4, the redistribution layer 20 may be a double-layer structure or a multi-layer structure. In one embodiment illustrated in FIGS. 3-4, each redistribution wire may be disposed in a layer different from the first connecting wire 24 and the second connecting wire 25. In one embodiment, the chip package structure may include two or more input soldering pads 31, each of the input soldering pads 31 may be wired out to a suitable position by the first connecting wire 24, to make each of the input soldering pads 31 have a same size for meeting connecting needs. In some embodiments, the chip package structure may include two second redistribution wires 22 with same signals. At least one second connecting wire 25 may be disposed to connect the two second redistribution wires 22 and make the two second redistribution wires 22 being wired out through a same output soldering pad 32 or a same array of soldering pads 32. The at least one second connecting wire 25 and the two second redistribution wires 22 may be disposed in different layers. The at least one second connecting wire 25 may not interfere the redistribution wires, and a longitudinal arrangement space of wires may be incremented when a lateral arrangement space is limited. An integration level of the chip package structure may be improved further.

The first connecting wire 24 and the second connecting wire 25 may be disposed by a fan-out package structure same as the redistribution wires. Correspondingly, the connecting wires and the redistribution wires may together form the redistribution layer 20 of the chip package structure. In various embodiments, the connecting wires and the redistribution wires may be made of same materials or different materials. The present disclosure has no limit on this.

FIGS. 1-4, other film layer structures are not shown. The first redistribution wire 21, the second redistribution wire 22, and the third redistribution wire 23 are filled with different patterns. For description purposes only, the embodiment in FIGS. 1-4 with a wire arrangement of the redistribution layer 20 is used as an example to illustrate the present disclosure and should not limit the scopes of the present disclosure. In various embodiments, the arrangement of wires in the redistribution layer 20 may be configured according to actual needs.

In the present disclosure, the plurality of bare chips may be packaged together by a fan-out package method and signals may be transmitted between the plurality of bare chips through the redistribution layer. The redistribution layer may be a single layer structure or a multi-layer structure according to actual needs. A space occupied by the wires may be reduced. Correspondingly, the integration level of the chip package structure may be improved and a power consumption of the electronic products may be reduced. A portion of the connecting posts in the plurality of bare chips for externally connecting signals may be wired out through the soldering pad group, and a remaining portion of the connecting posts in the plurality of bare chips may be connected inside the chip package structure through the third redistribution wire. Correspondingly, a single chip package structure may be used to substitute the current structure where bare chips are packaged independently and then are assembled with the PCB. The chip package structure may be simplified. The formation and application of the chip package structure may be convenient since a ball implanting process may be avoided. A production cost of the electronic products may be reduced, and a good product ratio and a productivity of the electronic products may be improved.

Figure 5:
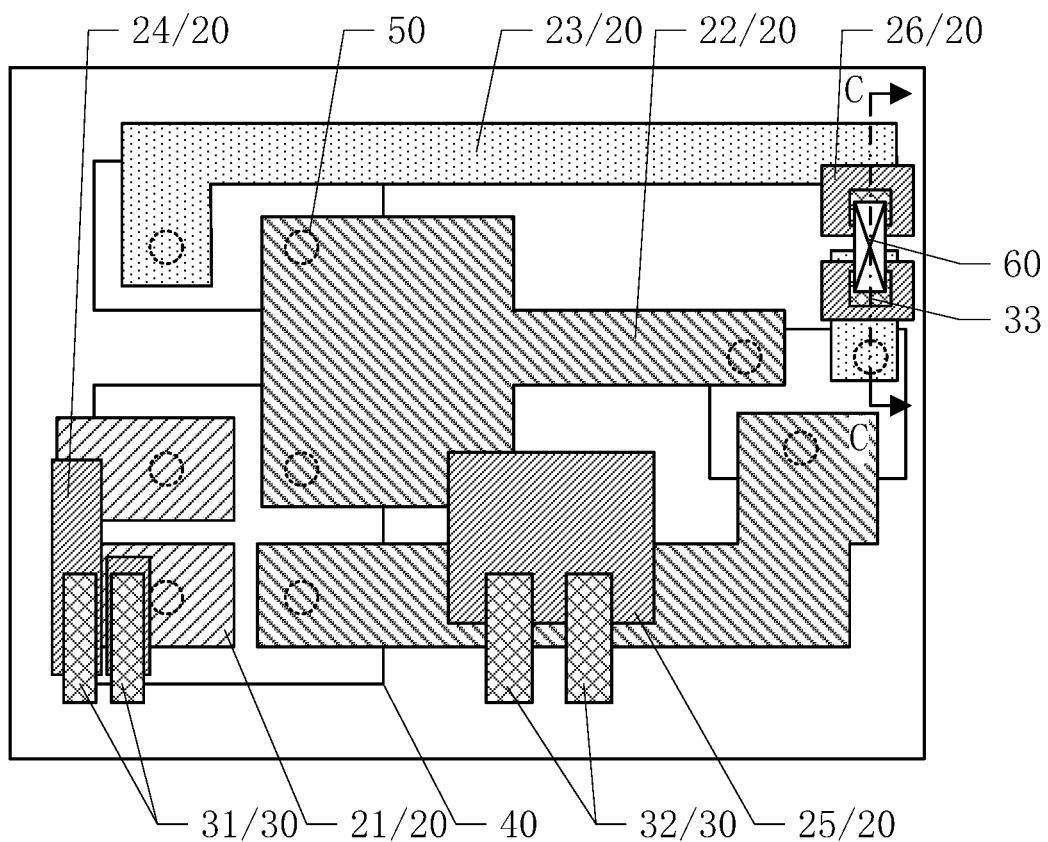
FIG. 5 illustrates a planar structure of another exemplary chip package structure consistent with various disclosed embodiments in the present disclosure.
Figure 6:
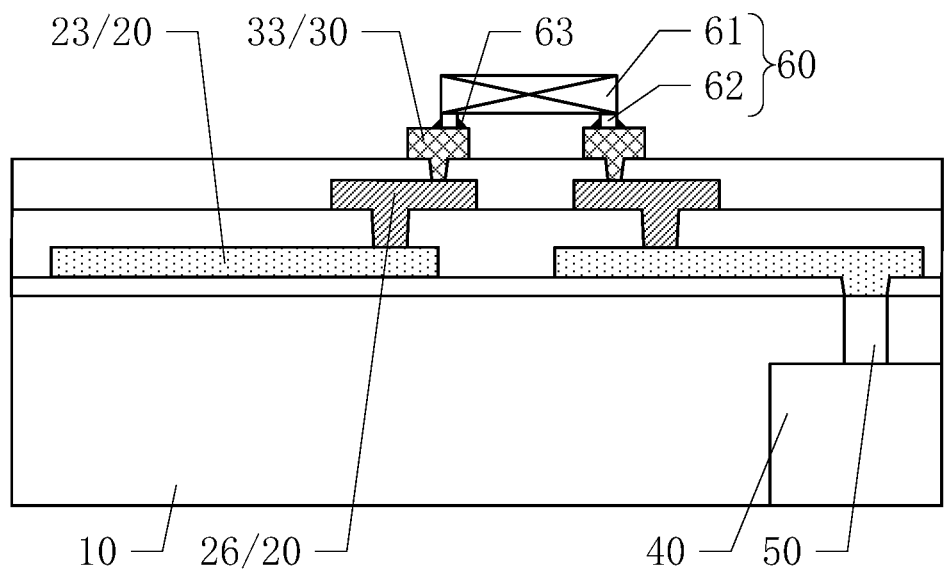
FIG. 6 illustrates a cross-section view of the chip package structure in FIG. 5 along a C-C direction consistent with various disclosed embodiments in the present disclosure.

In some embodiments illustrated in FIGS. 5-6, the soldering pad group 30 may further include connecting soldering pads 33. The connecting soldering pads 33 may be electrically connected to the redistribution layer 20. The chip package structure may further include at least one electronic device 60. The at least one electronic device 60 may include a device body 61 and a plurality of pins 62 on the device body 61. The plurality of pins 62 may be electronically connected to the connecting soldering pads 33. For description purposes only, the embodiment illustrated in FIGS. 5-6 where the chip package structure includes one electronic device 60 is used as an example to explain the present disclosure, and should not limit the scope of the present disclosure. In various embodiments, the chip package structure may include one or more electronic devices.

In one embodiment, when the connecting soldering pads 33 are electrically connected to the redistribution layer 20, the connecting soldering pads 33 may be electrically connected to the third redistribution wire 23 directly. For description purposes only, the embodiment in FIGS. 5-6 where the connecting soldering pads 33 are electrically connected to the third redistribution wire 23 directly is used as an example to illustrate the present disclosure and should not limit the scopes of the present disclosure. In various embodiments, when the connecting soldering pads 33 are electrically connected to the redistribution layer 20, the connecting soldering pads 33 may be electrically connected to the third redistribution wire 23 directly or through the third connecting wire 26. In some other embodiments, the connecting soldering pads 33 may be electrically connected to any other suitable redistribution circuits. The present disclosure has no limit on this.

In the present disclosure, the at least one external electronic device 60 may improve a flexible arrangement of wires in the chip package structure to meet a large diversity of actual needs. A package of the at least one external electronic device 60 with a large scale and the plurality of bare chips 40 together may increase a size of the chip package structure and may decrease an integration level of the chip package structure. In the present disclosure, the at least one external electronic device 60 may be connected to the chip package structure through an external connection structure. The integration level of the chip package structure may be improved. In various embodiments, the at least one external electronic device 60 may have any suitable size according to actual needs and the present disclosure has no limit on this. For example, in some embodiments, the at least one external electronic device 60 may have a small size.

The at least one external electronic device 60 may have the plurality of pins 62 on the device body 61, and the at least one external electronic device 60 may be electrically connected to the connecting soldering pads 33 through the plurality of pins 62. The third redistribution wire 23 may break at a position corresponding to the at least one external electronic device 60 to prevent the circuits from short after connecting the at least one external electronic device 60.

In one embodiment illustrated in FIGS. 5-6, the plurality of pins 62 may be electrically connected to the connecting soldering pads 33 through soldering materials 63. The at least one external electronic device 60 may be fixed on the connecting soldering pads 33 by a soldering process, to make sure a reliability of the electrical connections. The at least one external electronic device 60 may be removed by melting the soldering materials 63. The removing process may be simple and may have a light labor.

The soldering materials 63 may be made of materials including copper, tin, lead, zinc, nickel, manganese, iron, or any combination thereof.

In one embodiment illustrated in FIGS. 5-6, the at least one external electronic device 60 may be a resistor, a capacitor, an inductor, and/or a diode. In various embodiments, the chip package structure may have a diversity of functions and may be used widely by configuring types and a number of the at least one external electronic device 60.

Figure 7:
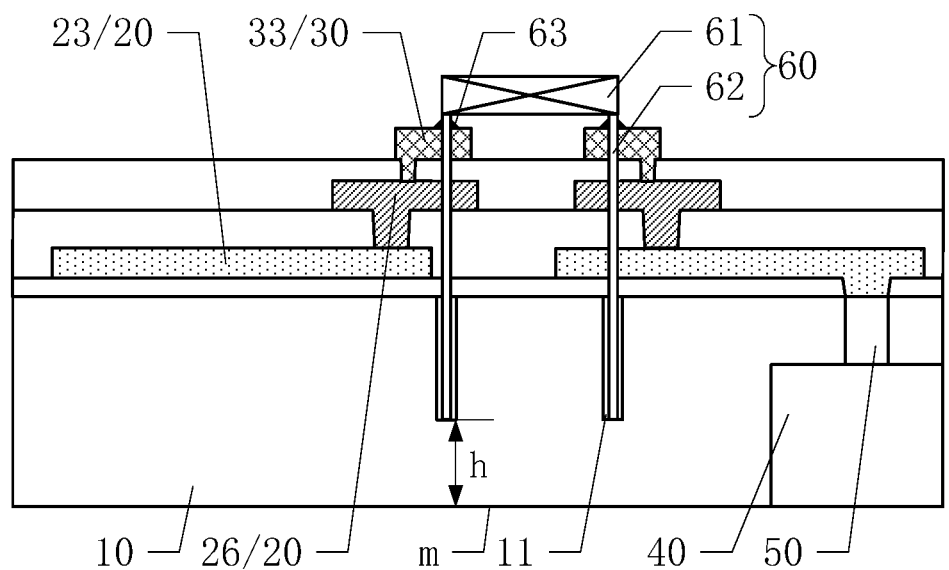
FIG. 7 illustrates another cross-section view of the chip package structure in FIG. 5 along a C-C direction consistent with various disclosed embodiments in the present disclosure.

In one embodiment illustrated in FIG. 5 and FIG. 7, the encapsulating layer 10 may include a plurality of accommodating chambers 11. The plurality of pins 62 may be disposed in the plurality of accommodating chambers 11 after penetrating through the connecting soldering pads 33.

In the present disclosure, the encapsulating layer 10 may cover the plurality of bare chips 40 and the plurality of connecting posts 50. The encapsulating layer 10 may have a large thickness correspondingly. By forming the plurality of accommodating chambers 11 in the encapsulating layer 10, the at least one electronic device 60 including the plurality of pins 62 with a large length may meet assembly needs well. When soldering the at least one electronic device 62, the soldering materials 63 may fill gaps between the plurality of pins 62 and the connecting soldering pads 33, to prevent external matters including water and oxygen from affecting the performance of the chip package structure and improve a reliability of the electrical connections.

In various embodiments, sidewalls of the plurality of accommodating chambers 11 may be made of a material same as or different from the encapsulating layer 10. The present disclosure has no limit on this. A size of the plurality of accommodating chambers 11 may larger than a size of the plurality of pins 62 to accommodate the plurality of pins 62 easily.

In one embodiment illustrated in FIG. 7, a side surface of the encapsulating layer 10 away from the redistribution layer 20 may be a first surface m. Along a direction perpendicular to a plane of the plurality of bare chips 40, a distance between the plurality of accommodating chambers 11 and the first surface m may be h. h≥0.

In one embodiment where the thickness of the encapsulating layer 10 is enough, the distance h between the plurality of accommodating chambers 11 and the first surface m may be larger than 0. In other embodiments where the thickness of the encapsulating layer 10 is small and/or the length of the plurality of pins 62 is large, the distance h between the plurality of accommodating chambers 11 and the first surface m may be 0 and the plurality of accommodating chambers 11 may penetrate through the encapsulating layer 10. Correspondingly, there is no need to cut the plurality of pins 62 for assembling the at least one electronic device 60 on the chip package structure.

Figure 8:
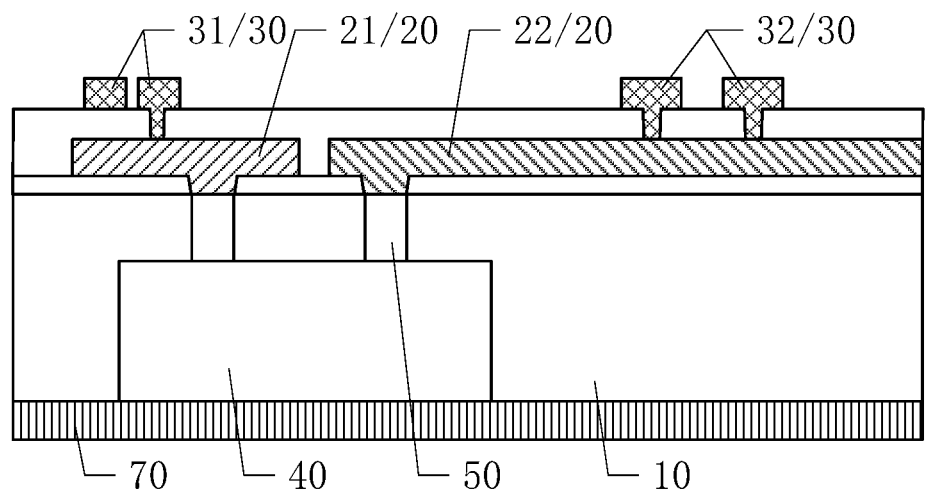
FIG. 8 illustrates another cross-section view of the chip package structure in FIG. 1 along an A-A direction consistent with various disclosed embodiments in the present disclosure.

In one embodiment illustrated in FIG. 1 and FIG. 8, the chip package structure may further include a protective layer 70 on a side of the encapsulating layer 10 away from the redistribution layer 20 and on a side of the plurality of bare chips 40 away from the redistribution layer 20.

In the present disclosure, the protective layer 70 may disposed on the side of the encapsulating layer 10 away from the redistribution layer 20 and on the side of the plurality of bare chips 40 away from the redistribution layer 20. The protective layer 70 and the encapsulating layer 10 may together protect the plurality of bare chips 40, to prevent external environments from affecting the performance of the plurality of bare chips 40.

In one embodiment, the protective layer 70 and the encapsulating layer 10 may be made of a same material including EMC, and may be molded by an injecting molding process. The chip package process may be simplified and a production efficiency of the electronic products may be improved. In other embodiments, the protective layer 70 may be made of any other suitable materials and the present disclosure has no limit on this.

Figure 9:
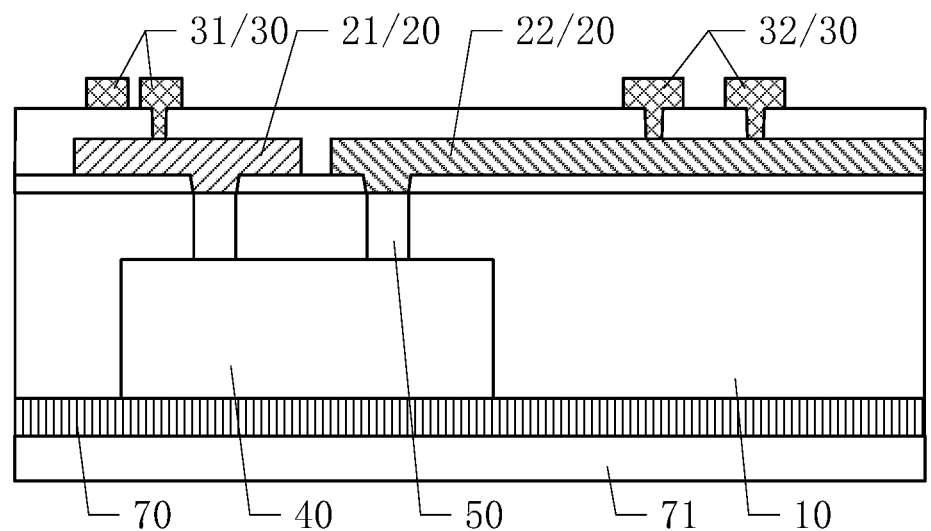
FIG. 9 illustrates another cross-section view of the chip package structure in FIG. 1 along an A-A direction consistent with various disclosed embodiments in the present disclosure.

In one embodiment illustrated in FIG. 1 and FIG. 9, the chip package structure may further include a flexible substrate 71 on a side of the protective layer 70 away from the redistribution layer 20.

In the present disclosure, the flexible substrate 71 may be disposed on a side of the protective layer 70 away from the redistribution layer 20. The whole chip package structure may be packaged at the panel level by using the flexible substrate 71 as a substrate. A space utilization may be improved and the integration level of the chip package structure may be improved. The protective layer 20 may be made of a material with a good sealing and a good high-temperature resistance including silicide. Correspondingly, the protective layer 20 may block a high temperature when forming the encapsulating layer 10 by the injecting molding process and protect the flexible substrate 71, and may also prevent the external matters such as water and oxygen from affecting the performance of the chip package structure.

The flexible substrate 71 may be made of a material including polyimide, polypropylene resin, and/or acrylic resin, to make the chip package structure flexible.

Figure 10:
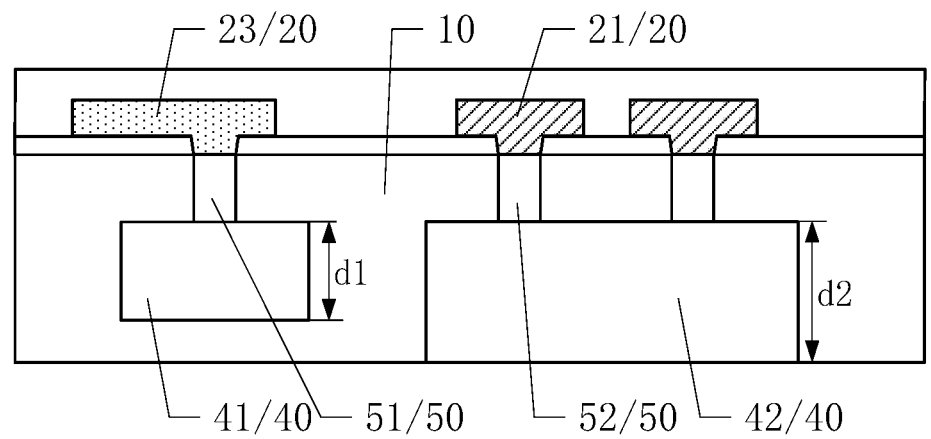
FIG. 10 illustrates a cross-section view of the chip package structure in FIG. 1 along an A'-A' direction consistent with various disclosed embodiments in the present disclosure.
Figure 11:
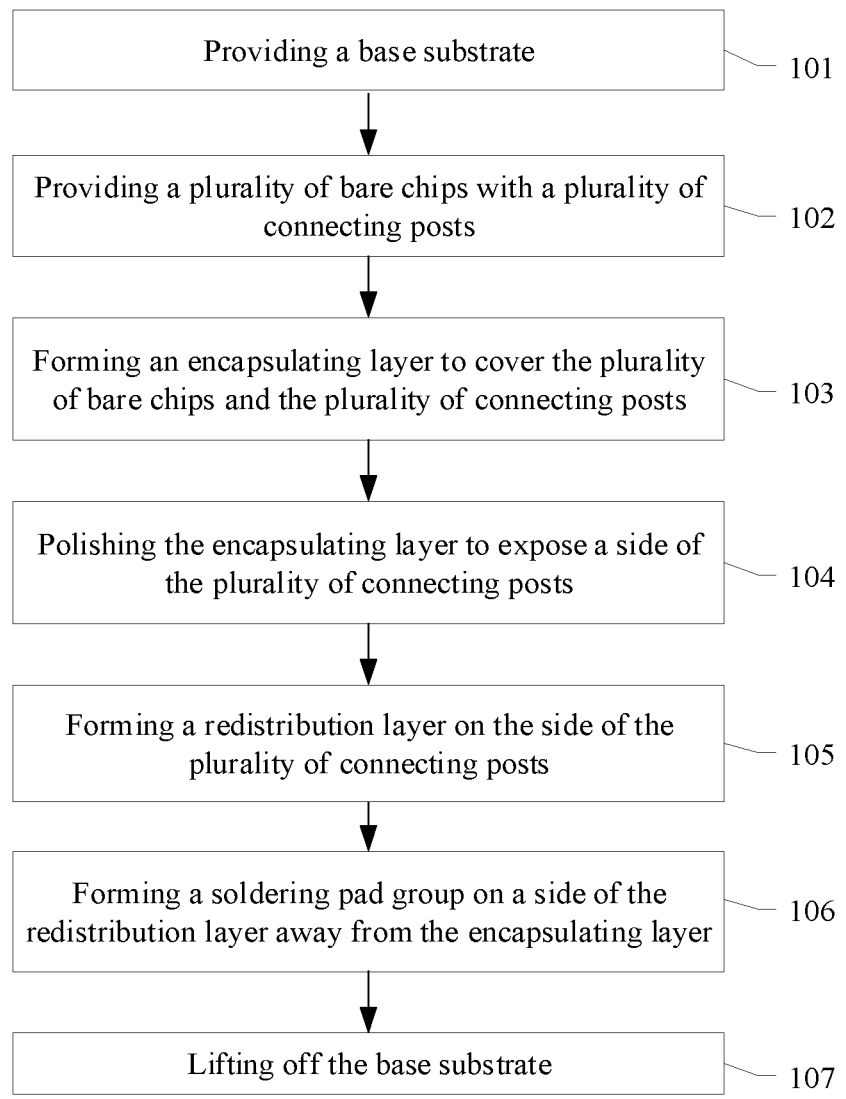
FIG. 11 illustrates an exemplary chip package method consistent with various disclosed embodiments in the present disclosure.
Figure 12:
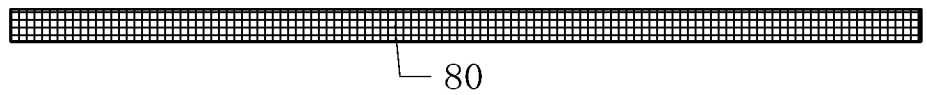
FIGS. 12-17 illustrate cross-section views of an exemplary chip package structure corresponding to different steps of the chip package method in FIG. 16 consistent with various disclosed embodiments in the present disclosure.
Figure 13:
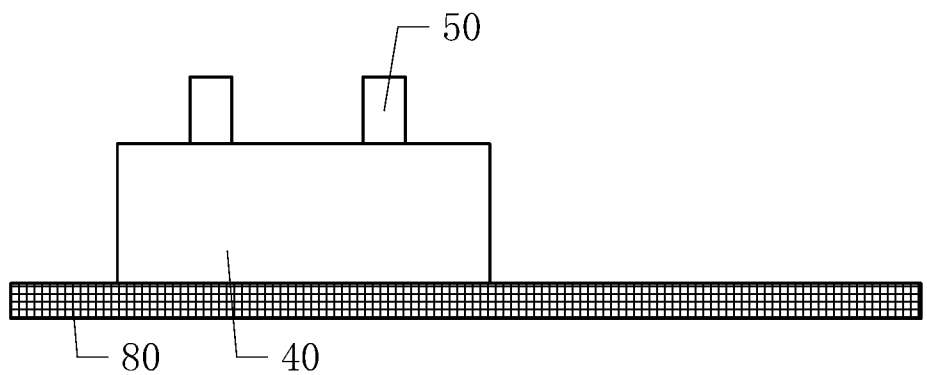
Figure 14:
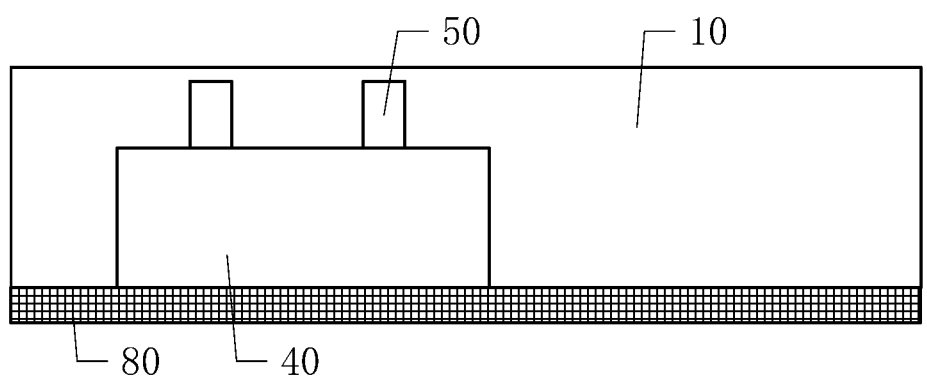
Figure 15:
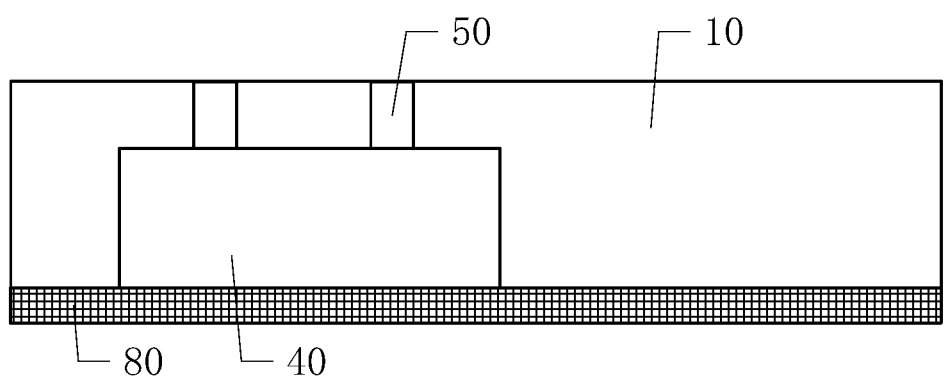
Figure 16:
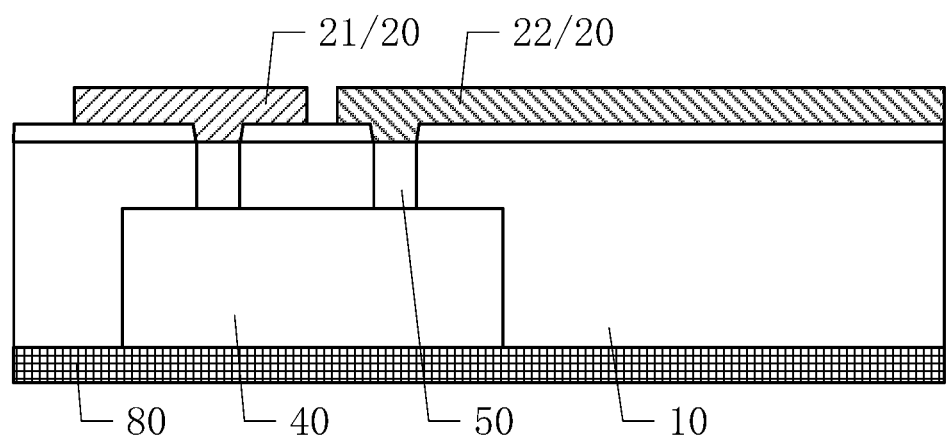
Figure 17:
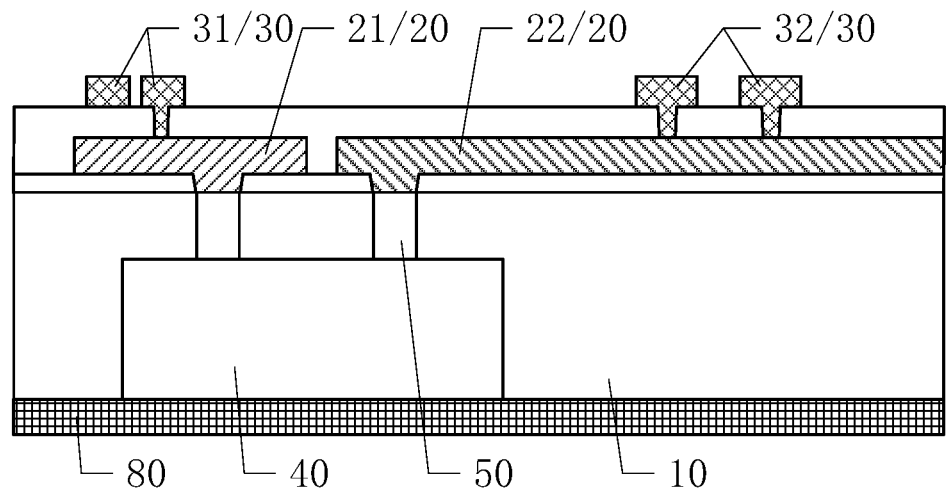
Figure 18:
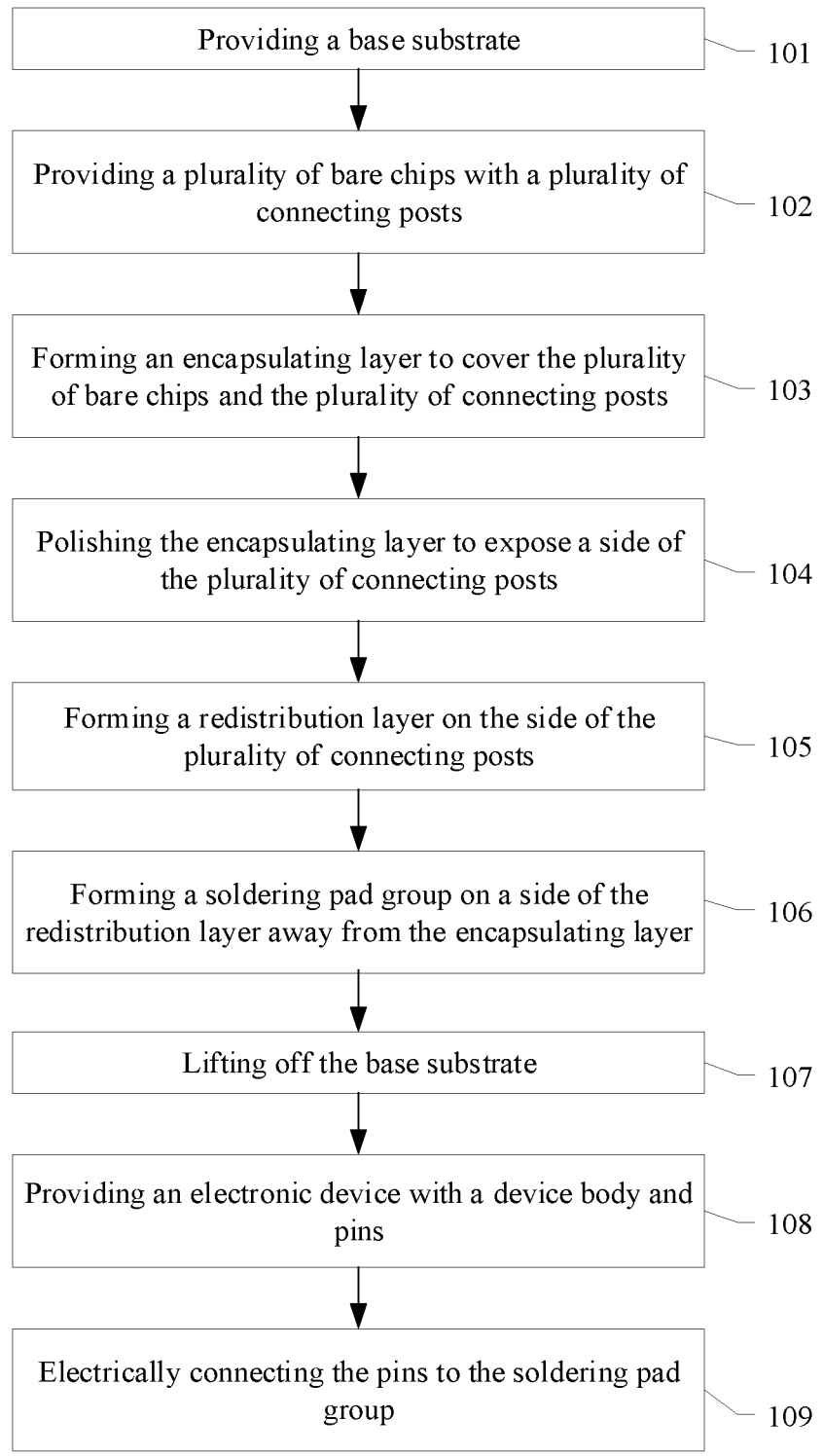
FIG. 18 illustrates another exemplary chip package method consistent with various disclosed embodiments in the present disclosure.

In one embodiment illustrated in FIG. 1 and FIG. 10, the plurality of bare chips 10 may include at least one first bare chip 41 and at least one second bare chip 42. Along the direction perpendicular to the plane of the plurality of bare chips 40, the least one first bare chip 41 may have a height d1 and the at least one second bare chip 42 may have a height d2 different from d1.

The plurality of connecting posts 50 may include first connecting posts 51 on the at least one first bare chip 41 and second connecting posts 52 on the at least one second bare chip 42. A side surface of the first connecting posts 51 close to the redistribution layer 20 may be flush with a side surface of the second connecting posts 52 close to the redistribution layer 20.

In the present disclosure, along the direction perpendicular to the plane of the plurality of bare chips 40, the height d1 of the first connecting posts 51 may be different from the height d2 of the second connecting posts 52. In one embodiment, the height d1 of the first connecting posts 51 may be smaller than the height d2 of the second connecting posts 52. Correspondingly, the at least one first bare chip 41 may be completely covered by the encapsulating layer when a height of the first connecting posts 51 is small. The height of the first connecting posts 51 may be configured to make a side surface of the at least one first bare chips 41 away from the redistribution layer 20 flush with a side surface of the at least one second bare chips 42 away from the redistribution layer 20. For description purposes only, the embodiment in FIG. 1 and FIG. 10 where the side surface of the at least one first bare chips 41 away from the redistribution layer 20 is flush with the side surface of the at least one second bare chips 42 away from the redistribution layer 20 is used as an example to illustrate the present disclosure and should not limit the scopes of the present disclosure. In various embodiments, the height of the plurality of bare chips 40 may be different to meet actual package needs for chips with different size. The present disclosure has no limit on this.

In one embodiment, the side surface of the first connecting posts 51 close to the redistribution layer 20 may be flush with the side surface of the second connecting posts 52 close to the redistribution layer 20. Since the encapsulating layer 10 may expose the side surface of the plurality of connecting posts 50 away from the plurality of bare chips 40, each of the redistribution wires may be electrically and directly connected to the first connecting posts 51 and the second connecting posts 52 when forming the redistribution layer 20. The connecting reliability of wires in the chip package structure may be improved. In various embodiments, the encapsulating layer 10 may be processed by various methods including a polishing method and an etching method to expose the surface of the plurality of connecting posts 50. The present disclosure has no limit on this.

In one embodiment illustrated in FIG. 10, along the direction perpendicular to the plane of the plurality of bare chips 40, the height of the first connecting posts 51 may be same as the height of the second connecting posts 52. Correspondingly, the plurality of bare chips 40 may use the connecting posts 50 with a same configuration when providing the connecting posts 50 to the plurality of bare chips 40 with a same height or when providing the connecting posts 50 to the at least one first bare chip 41 and the at least one second bare chip 42 with different height. A cost of the chip package structure may be reduced.

The present disclosure also provides a chip package method for the chip package structure. In one embodiment illustrated in FIG. 1, FIG. 2, and FIGS. 11-17, the chip package method may include:

Step 101: providing a base substrate 80;

Step 102: providing a plurality of bare chips 40 and attaching the plurality of bare chips 40 to the base substrate 80, where a plurality of connecting posts 50 may be disposed on a side of the plurality of bare chips 40;

Step 103: forming an encapsulating layer 10 to cover the plurality of bare chips 40 and the plurality of connecting posts 50;

Step 104: polishing the encapsulating layer 10 to expose a side of the plurality of connecting posts 50 away from the plurality of bare chips 40;

Step 105: forming a redistribution layer 20 on the side of the plurality of connecting posts 50 away from the plurality of bare chips 40;

Step 106: forming a soldering pad group 30 on a side of the redistribution layer 20 away from the encapsulating layer 10; and Step 107: lifting off the base substrate 80.

The redistribution layer 20 may include the first redistribution wire 21, the second redistribution wire 22, and the third redistribution wire 23. The first redistribution wire 21 may be electrically connected to at least one of the plurality of connecting posts 50, and the second redistribution wire 22 may be electrically connected to at least one of the plurality of connecting posts 50. The redistribution wire 23 may be electrically connected to a remaining portion of the plurality of connecting posts 50. The soldering pad group 30 may include an input soldering pad 31 and an output soldering pad 32. The input soldering pad 31 may be electrically connected the second redistribution wire 22, and the output soldering pad 32 may be electrically connected to the first redistribution wire 21.

In the present disclosure, the base substrate 80 may temporarily support the chip package structure. The base substrate 80 may be a substrate including a glass substrate, a silicon substrate, and a substrate of other suitable materials.

When attaching the plurality of bare chips 40 to the base substrate 80, alignment parts and/or alignment marks may be disposed on the base substrate 80 in advance, to make each of the plurality of bare chips 40 be aligned on the base substrate 80 precisely. Subsequently, the base substrate 80 may be lifted off by a chemical lifting process or a laser lifting process. The present disclosure has no limit on this.

In one embodiment, the redistribution layer 20 may be formed by: forming a metal seed layer and then plating metal to form the redistribution wires. The metal seed layer may provide a good conduction for the subsequently formed redistribution wires. A production cost may be reduced. In other embodiments, the redistribution layer 20 may be formed by: forming a metal layer and etching the metal layer to form the redistribution wires. The present disclosure has no limit on this. Since each of the redistribution wires in the redistribution layer 20 may be electrically connected to the plurality of connecting posts 50, the encapsulating layer 10 may be polished to expose the side of the plurality of connecting posts 50 away from the plurality of bare chips 40 before forming the redistribution layer 20, to increase a connecting strength between the redistribution layer 20 and the plurality of connecting posts 50. In some other embodiments, the encapsulating layer 10 may be processed by any other suitable methods including an etching method. The present disclosure has no limit on this.

In one embodiment illustrated in FIGS. 1-2, the redistribution layer 20 may be a single layer wiring structure. In some other embodiments illustrated in FIGS. 3-4, when the wire arrangement is complex, the redistribution layer 20 may be a double layer wiring structure or a multi-layer wiring structure. Each of the redistribution wires may be electrically connected to the corresponding one of the connecting wires, to make an arrangement of wires in the redistribution layer 20 more flexible.

Since the soldering pad group 30 may be made of metal, the soldering pad group 30 may be formed by a process same as the redistribution layer 20. The formation of the soldering pad group 30 can be referred to the description of the redistribution layer 20.

The first redistribution wire 21 may be electrically connected to at least one of the plurality of connecting posts 50, and the second redistribution wire 22 may be electrically connected to at least one of the plurality of connecting posts 50. The redistribution wire 23 may be electrically connected to a remaining portion of the plurality of connecting posts 50. Correspondingly, except for a portion of the plurality of connecting posts 50 for inputting and outputting signals, a remaining portion of the plurality of connecting posts 50 may be wired directly through the third redistribution wire 23, to achieve an electrical connection between different bare chips of the plurality of bare chips 40. A wiring out through the soldering pad group 30 may be avoided. Correspondingly, an independent package of each of the plurality of bare chips and a subsequent assembly between the plurality of bare chips and the PCB may be achieved through a single chip package structure. An integration level of the chip package structure may be improved to meet a miniaturization of electronic products. A product efficiency may be improved. The present disclosure also may have a lower cost than the current technology where each chip is packaged independently and then is soldering to the PCB. Since a ball implantation process may be avoided, the present disclosure is more convenient, and the chip package structure may have a high reliability. A good product ratio of the electronic products may be improved. A wiring distance in the chip package structure where the plurality of bare chips is packaged together may be reduced effectively. A power consumption of the electric products may be reduced then.

In another embodiment illustrated in FIGS. 5-6 and FIGS. 18-19, when forming the soldering pad group 30 in Step 106, the soldering pad group 30 may further include connecting soldering pads 33.

Before or after lifting off the base substrate 80 in Step 107, the chip package method may further include:

Step 108: providing at least one electronic device 60 with a device body 61 and a plurality of pins 62 on the device body 61; and Step 109: electrically connecting the plurality of pins 62 to the connecting soldering pads 33.

In the present disclosure, an assembly of the at least one electronic device 60 may be performed before or after lifting off the base substrate 80. For description purposes only, the embodiment where the assembly of the at least one electronic device 60 is performed after lifting off the base substrate 80 is used as an example to illustrate the present disclosure and should not limit the scopes of the present disclosure. The present disclosure has no limit on this. In the present disclosure, the at least one external electronic device 60 may improve a flexible arrangement of wires in the chip package structure to meet a large diversity of actual needs. A package of the at least one external electronic device 60 with a large scale and the plurality of bare chips 40 together may increase a size of the chip package structure and may decrease an integration level of the chip package structure. In the present disclosure, the at least one external electronic device 60 may be connected to the chip package structure through an external connection structure. The integration level of the chip package structure may be improved. In various embodiments, the at least one external electronic device 60 may have any suitable size according to actual needs and the present disclosure has no limit on this. For example, in some embodiments, the at least one external electronic device 60 may have a small size.

Figure 19:
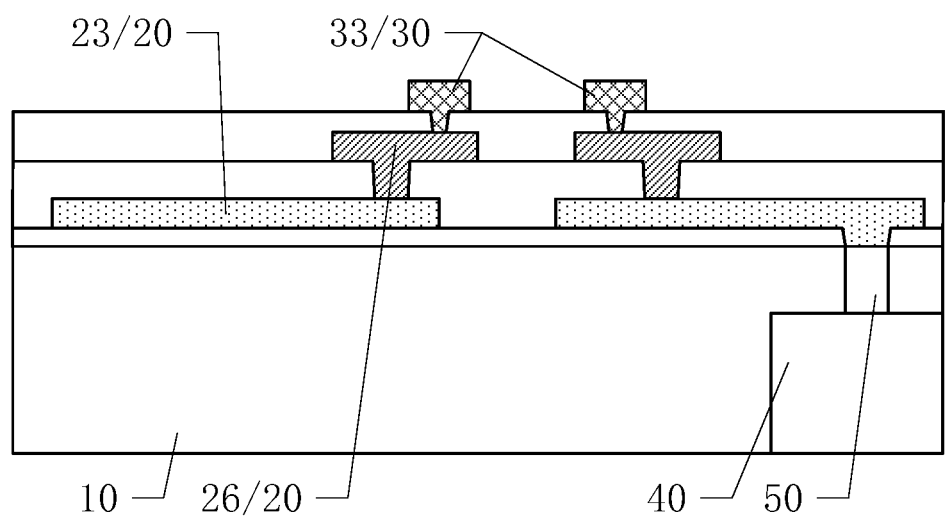
FIG. 19 illustrates a cross-section view of an exemplary chip package structure corresponding to the chip package method in FIG. 18 consistent with various disclosed embodiments in the present disclosure
Figure 20:
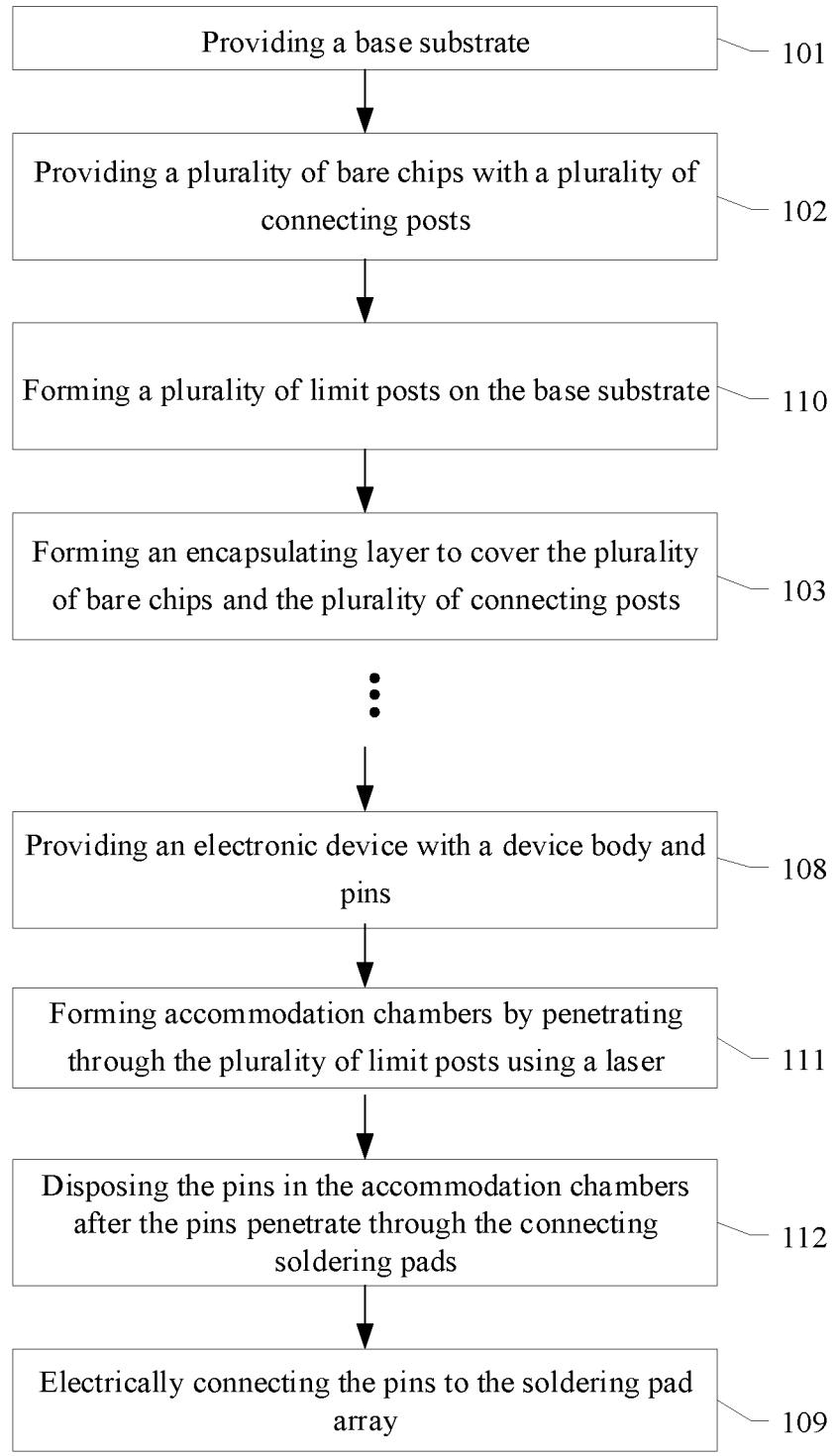
FIG. 20 illustrates another exemplary chip package method consistent with various disclosed embodiments in the present disclosure.
Figure 21:
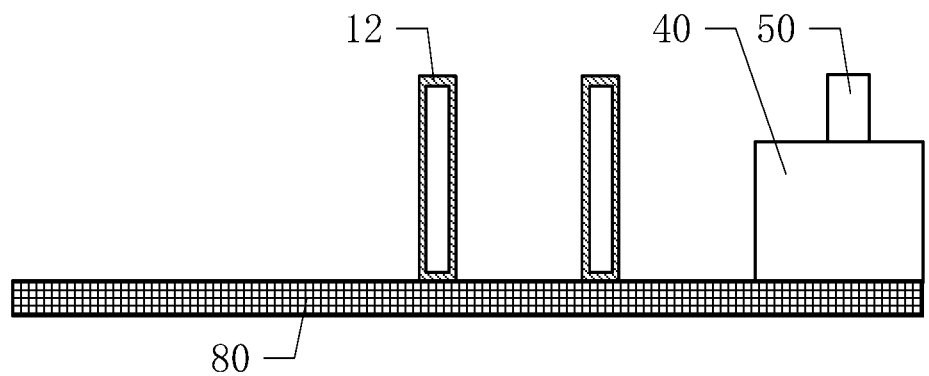
FIGS. 21-24 illustrate cross-section views of an exemplary chip package structure corresponding to different steps of the chip package method in FIG. 20 consistent with various disclosed embodiments in the present disclosure.
Figure 22:
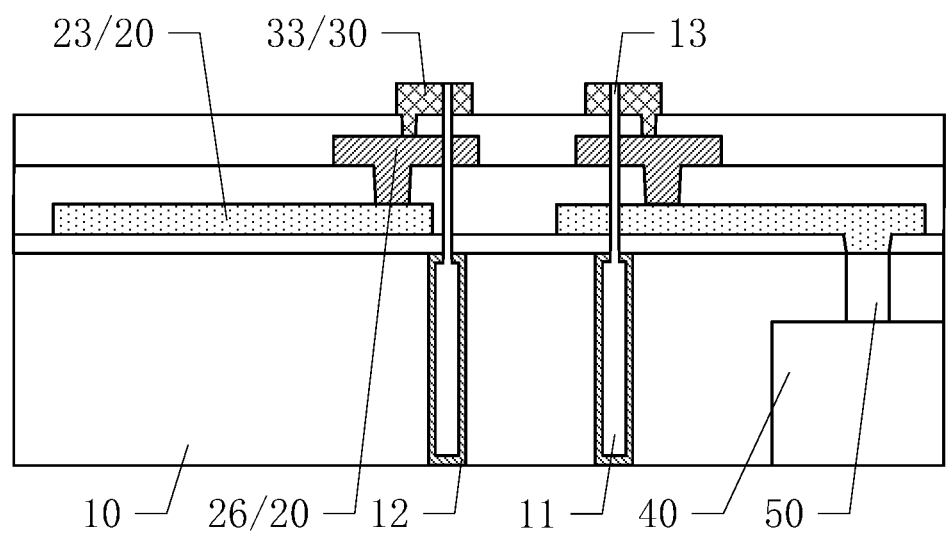
Figure 23:
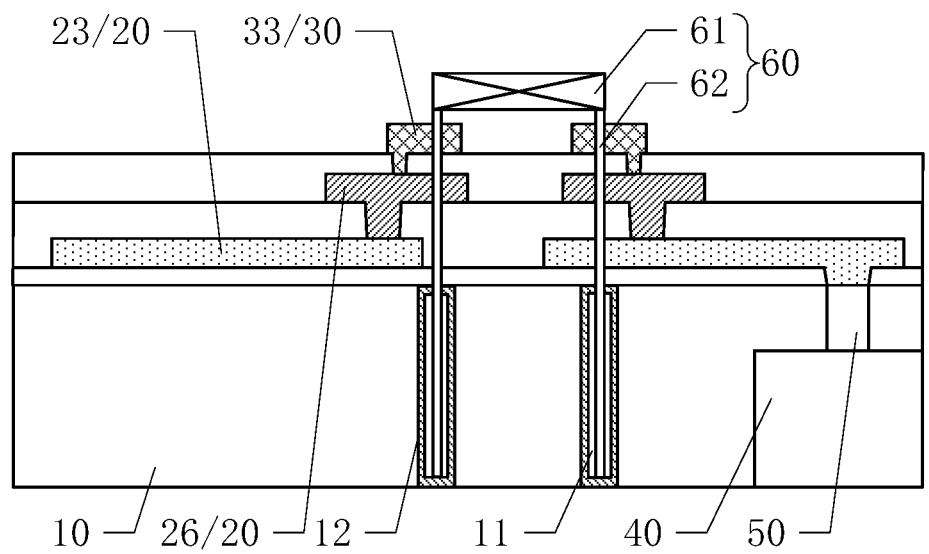
Figure 24:
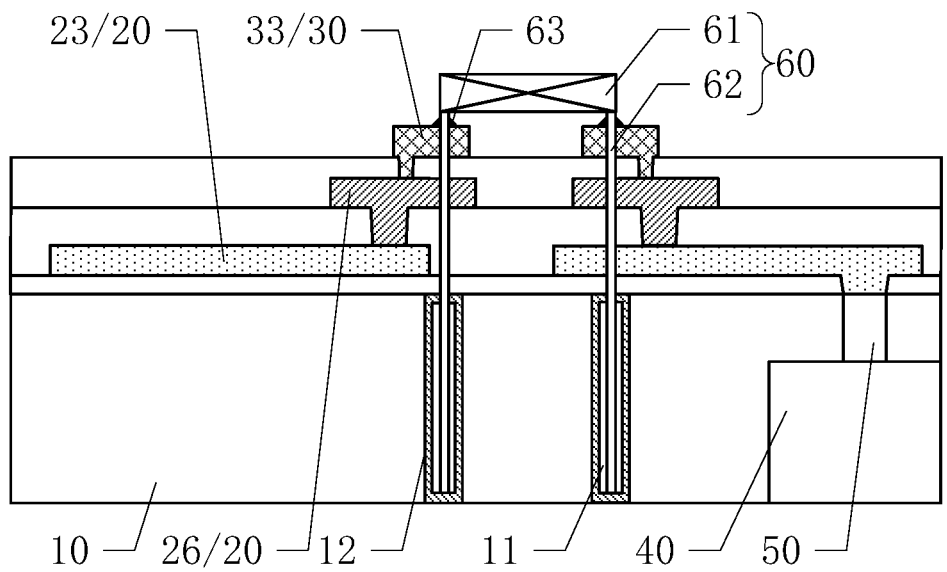

For description purposes only, the embodiment in FIG. 19 where the redistribution layer 20 has a double-layer or a multi-layer wiring structure is used as an example to illustrate the present disclosure and should not limit the scopes of the present disclosure. The present disclosure has no limit on this.

In one embodiment in FIG. 6, electrically connecting the plurality of pins 62 to the connecting soldering pads 33 in Step S109 may include electrically connecting the plurality of pins 62 to the connecting soldering pads 33 by a soldering process. The at least one external electronic device 60 may be fixed on the connecting soldering pads 33 through soldering materials 63, to make sure a reliability of the electrical connections. The at least one external electronic device 60 may be removed by melting the soldering materials 63. The removing process may be simple and may have a light labor.

In one embodiment illustrated in FIG. 5, FIG. 7, and FIGS. 20-24, before forming the encapsulating layer 10 in Step 103, the chip package method may further include: Step 110: disposing a plurality of limit posts 12 on the base substrate 80. Before electrically connecting the plurality of pins 62 to the connecting soldering pads 33 in Step S109, the chip package method may further include: Step 111: forming accommodating chambers 11 by using a laser to penetrate through the plurality of limit posts 12; and Step 112: disposing the plurality of pins 62 penetrating through the connecting soldering pads 33 in the accommodating chambers 11 after electrically connecting the plurality of pins 62 to the connecting soldering pads 33.

In the present disclosure, the accommodating chambers 11 may be formed by using a laser to penetrate through the plurality of limit posts 12, and the at least one electronic device 60 including the plurality of pins 62 with a large length may meet assembly needs well. Since the plurality of pins 62 may penetrate through the connecting soldering pads 33, assembling holes 13 connected to the accommodating chambers 11 may be formed in the connecting soldering pads 33 before assembling the at least one electronic device 60. The assembling holes 13 connected to the accommodating chambers 11 may also be formed in the film layers between the connecting soldering pads 33 and the plurality of limit posts 12. In various embodiments, the assembling holes 13 may be formed by a same laser process for forming the accommodating chambers 11, or may be formed by any other suitable processes including an etch process.

To form the accommodating chambers 11 easily, the plurality of limit posts 12 may be made of a material which is easily penetrated by the laser, including a metal, polyimide, and/or an inorganic non-metal material which is easily penetrated by the laser. Preferably, the plurality of limit posts 12 may have a hollow structure such as hollow copper posts. The assembling holes 13 and the hollow copper posts may be penetrated by the laser simultaneously. When the laser is incident on the hollow copper posts, the laser may penetrate tops of the hollow copper posts to form the accommodating chambers since the hollow copper posts are hollow. An energy consumption of the laser process may be reduced and a perforation accuracy may be improved.

When the encapsulating layer 10 is made of EMC, it is hard for the laser to penetrate through the encapsulating layer 10. The accommodating chambers 11 in FIG. 7 may be formed by any other suitable methods including an etch method. For description purposes only, the embodiment where the accommodating chambers 11 is formed from the plurality of limit posts 12 is used as an example to illustrate the present disclosure and should not limit the scopes of the present disclosure. The present disclosure has no limit on this.

Figure 25:
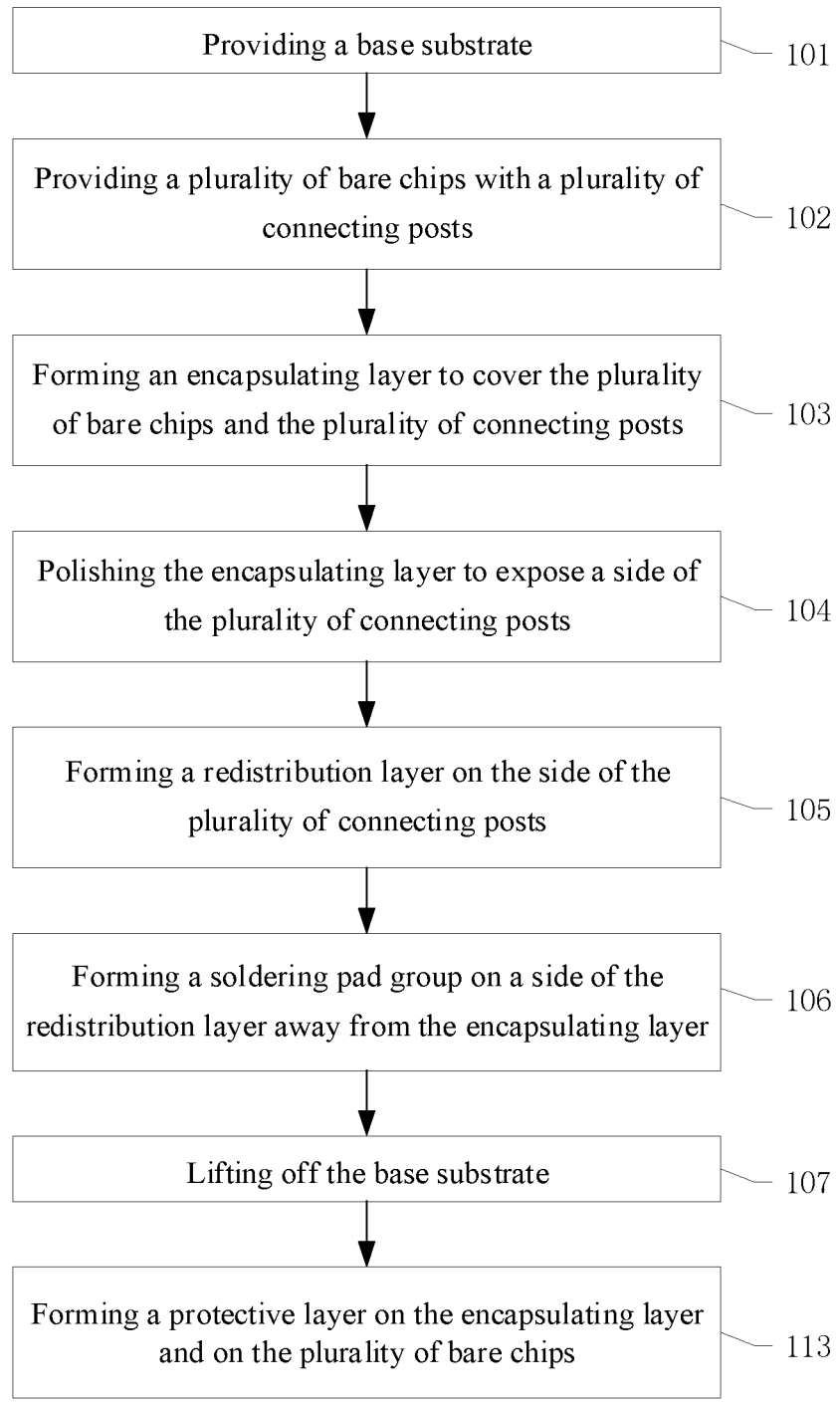
FIG. 25 illustrates another exemplary chip package method consistent with various disclosed embodiments in the present disclosure.
Figure 26:
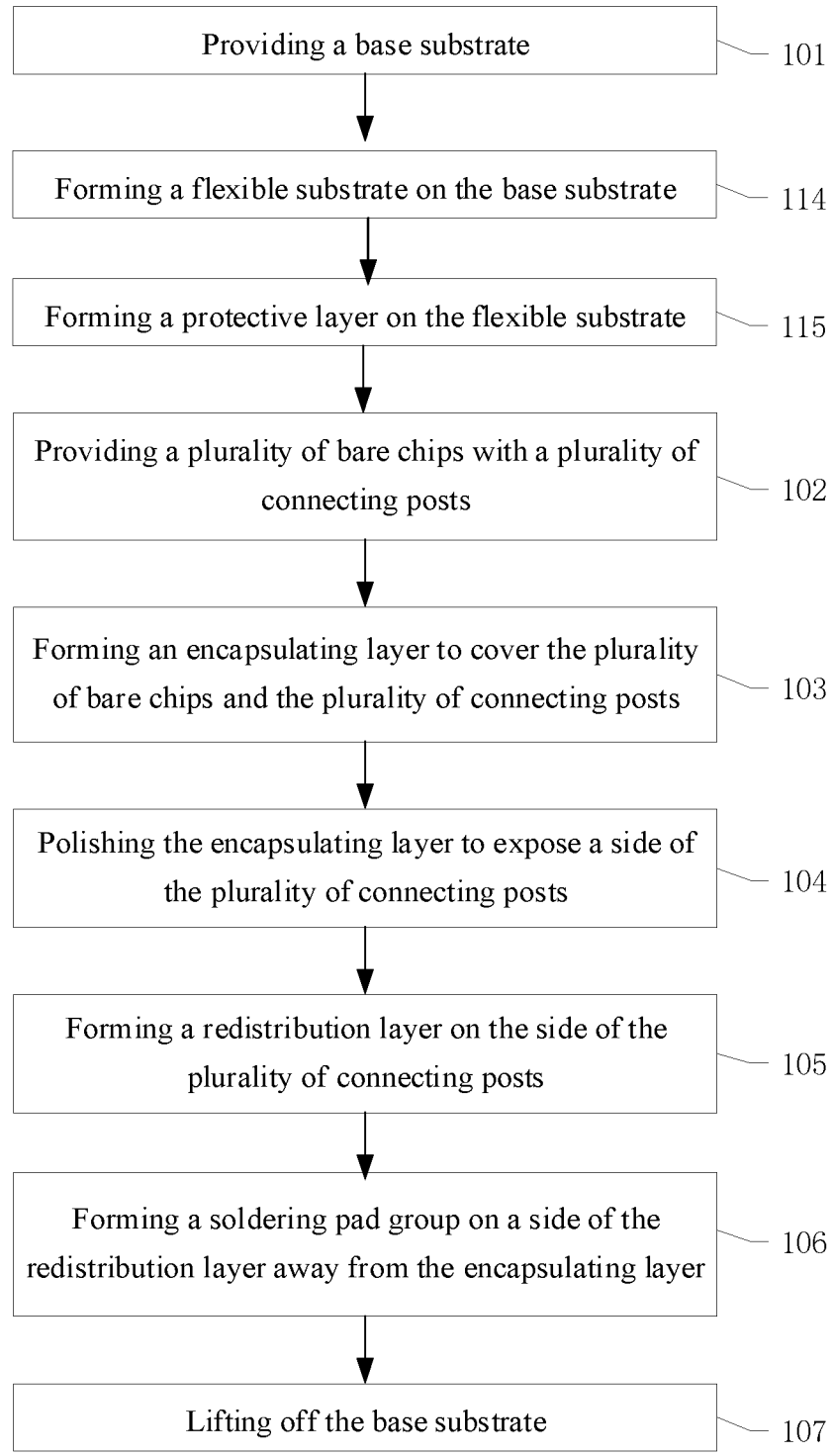
FIG. 26 illustrates another exemplary chip package method consistent with various disclosed embodiments in the present disclosure.
Figure 27:
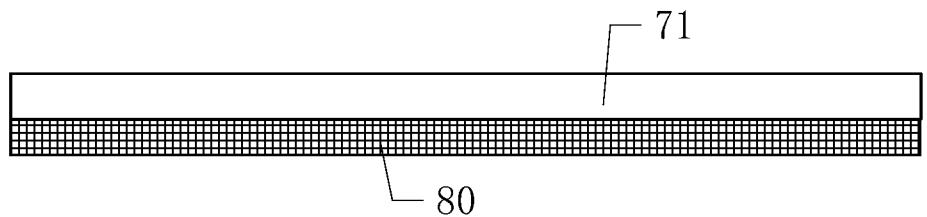
FIGS. 27-29 illustrate cross-section views of an exemplary chip package structure corresponding to different steps of the chip package method in FIG. 26 consistent with various disclosed embodiments in the present disclosure.
Figure 28:
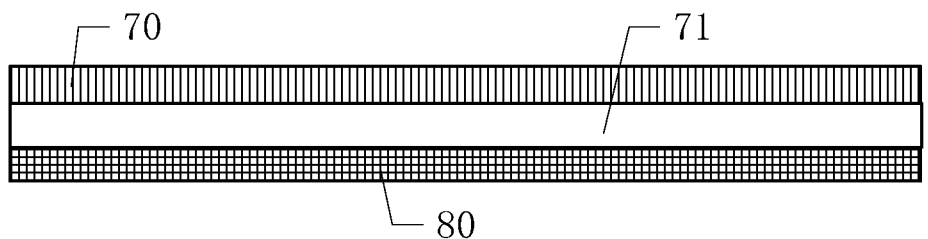
Figure 29:
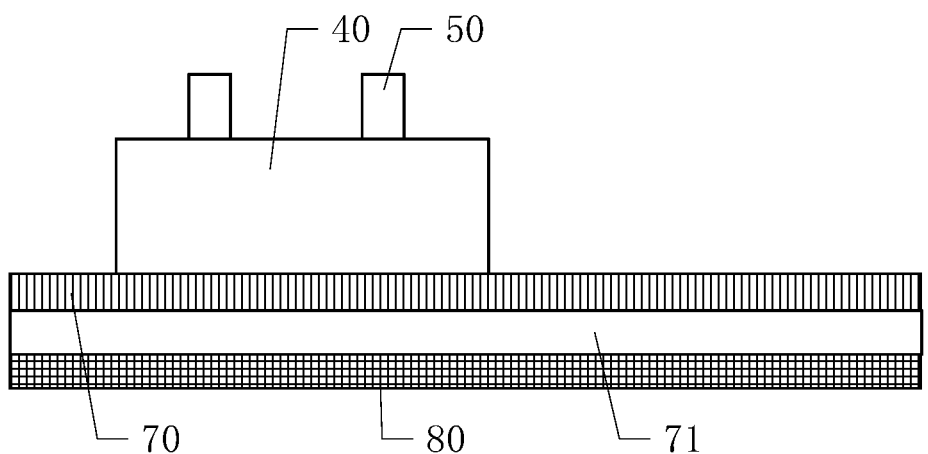
Figure 30:
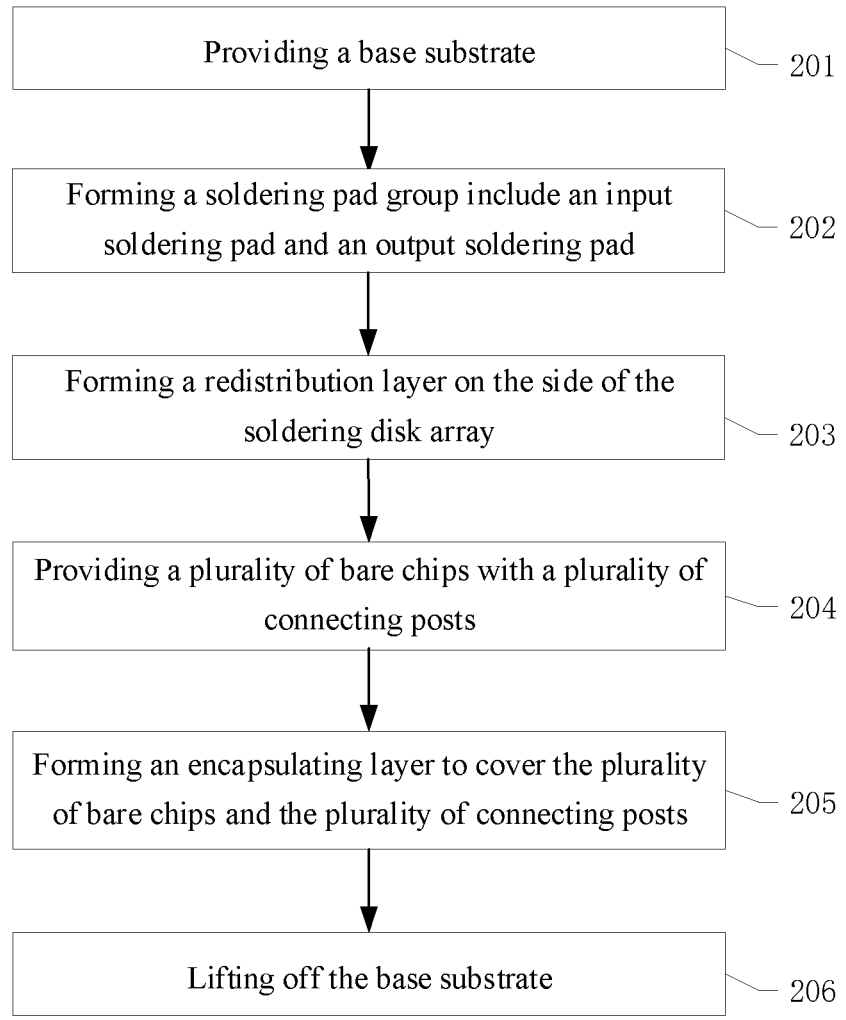
FIG. 30 illustrates another exemplary chip package method consistent with various disclosed embodiments in the present disclosure.
Figure 31:
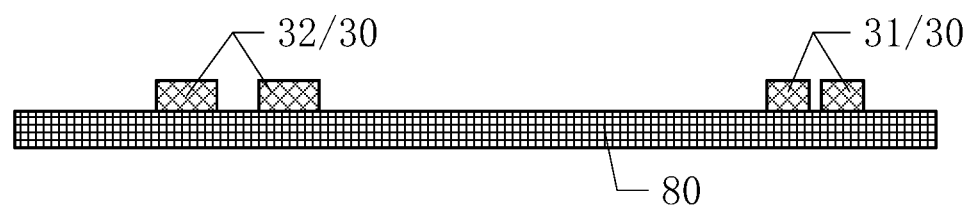
FIGS. 31-35 illustrate cross-section views of an exemplary chip package structure corresponding to different steps of the chip package method in FIG. 30 consistent with various disclosed embodiments in the present disclosure.
Figure 32:
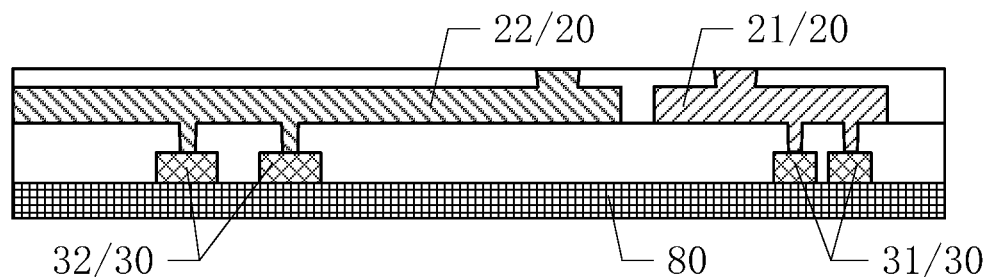
Figure 33:
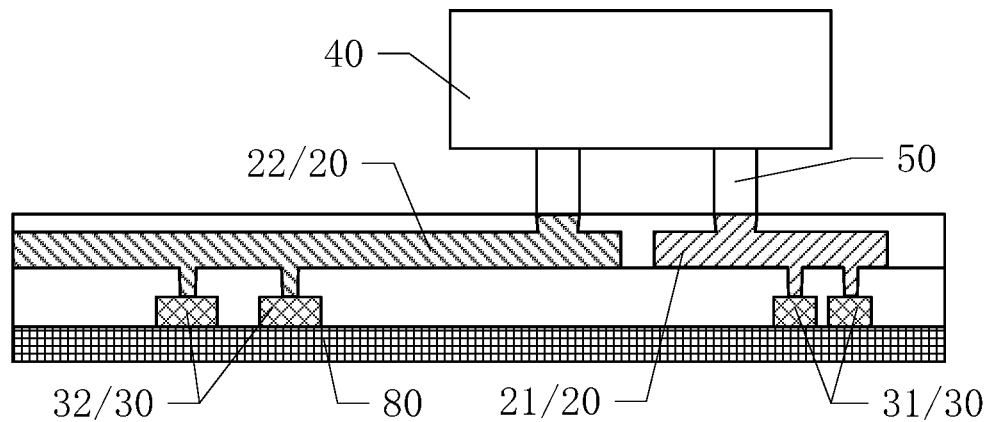
Figure 34:
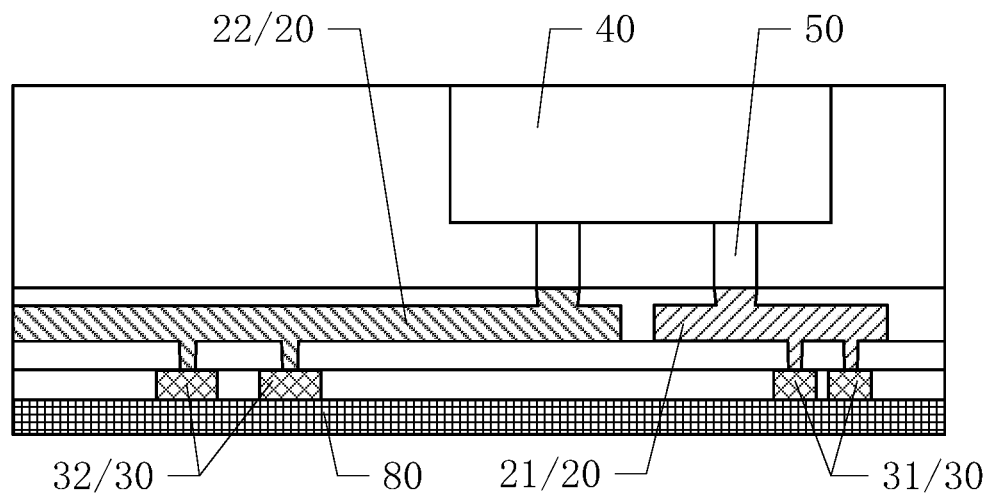

In one embodiment illustrated in FIG. 1, FIG. 8, and FIG. 25, after lifting off the base substrate 80 in Step 107, the chip package method may further include Step 113: forming a protective layer 70 on a side of the encapsulating layer 10 away from the redistribution layer 20 and on a side of the plurality of bare chips 40 away from the redistribution layer 20.

In the present disclosure, the protective layer 70 may disposed on the side of the encapsulating layer 10 away from the redistribution layer 20 and on the side of the plurality of bare chips 40 away from the redistribution layer 20. The protective layer 70 and the encapsulating layer 10 may together protect the plurality of bare chips 40, to prevent external environments from affecting the performance of the plurality of bare chips 40.

In one embodiment, the protective layer 70 and the encapsulating layer 10 may be made of a same material including EMC, and may be molded by an injecting molding process. The chip package process may be simplified and a production efficiency of the electronic products may be improved. In other embodiments, the protective layer 70 may be made of any other suitable materials and the present disclosure has no limit on this.

In one embodiment illustrated in FIG. 1, FIG. 9, and FIGS. 26-29, before providing the plurality of bare chips 40, the chip package method may further include:

Step 114: forming a flexible substrate 71 on the base substrate 80; and

Step 115: forming a protective layer 70 on the flexible substrate 71.

In the present disclosure, the protective layer 70 and the flexible substrate 71 may be formed before attaching the plurality of bare chips 40. The base substrate 80 may be lifted off from the flexible substrate 71, to prevent the process for lifting off the base substrate 80 from damaging the plurality of bare chips 40. An electric performance of the plurality of bare chips 40 may be guaranteed. The whole chip package structure may be packaged at the panel level by using the flexible substrate 71 as a substrate. A space utilization may be improved and the integration level of the chip package structure may be improved. The protective layer 20 may be made of a material with a good sealing and a good high-temperature resistance including silicide. Correspondingly, the protective layer 20 may block a high temperature when forming the encapsulating layer 10 by the injecting molding process and protect the flexible substrate 71, and may also prevent the external matters such as water and oxygen from affecting the performance of the chip package structure.

The steps after Step 102 may be referred to the description in above embodiments.

Various embodiments of the present disclosure also provide another chip package method for the chip package structure. In one embodiment illustrated in FIG. 1, FIG. 2, FIG. 12, and FIGS. 30-35, the chip package method may include:

Step 201: providing a base substrate 80;

Step 202: forming a soldering pad group 30 on the base substrate 80;

Step 203: forming a redistribution layer 20 on a side of the soldering pad group 30 away from the base substrate 80;

Step 204: providing a plurality of bare chips 40 and a plurality of connecting posts 50 on a side of the plurality of bare chips 40;

Step 205: forming an encapsulating layer 10 to cover the plurality of bare chips 40 and the plurality of connecting posts 50; and Step 206: lifting off the base substrate 80 to expose a surface of the soldering pad group 30.

The redistribution layer 20 may include the first redistribution wire 21, the second redistribution wire 22, and the third redistribution wire 23. The first redistribution wire 21 may be electrically connected to at least one of the plurality of connecting posts 50, and the second redistribution wire 22 may be electrically connected to at least one of the plurality of connecting posts SO. The redistribution wire 23 may be electrically connected to a remaining portion of the plurality of connecting posts 50. The soldering pad group 30 may include an input soldering pad 31 and an output soldering pad 32. The input soldering pad 31 may be electrically connected the second redistribution wire 22, and the output soldering pad 32 may be electrically connected to the first redistribution wire 21. In another embodiment, e input soldering pad 31 may be electrically connected the first redistribution wire 21, and the output soldering pad 32 may be electrically connected to the second redistribution wire 22.

In the present disclosure, the chip package structure may be formed by forming the soldering pad group 30 and the redistribution layer 20 in advance and then assembling the plurality of bare chips 40. The order of assembling the plurality of bare chips 40 is different in the present embodiment and the previous embodiment illustrated in FIG. 11. The formation of the soldering pad group 30 and the redistribution layer 20 may be referred to related description in the previous embodiment illustrated in FIG. 11.

Figure 35:
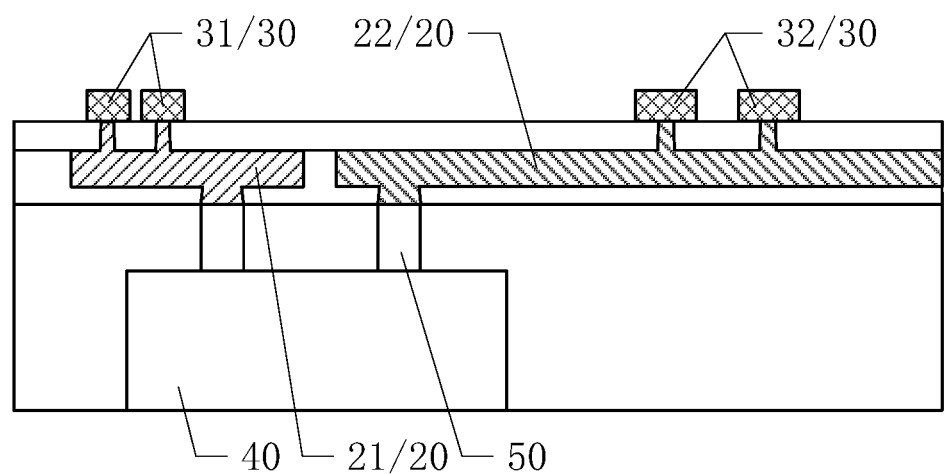
Figure 36:
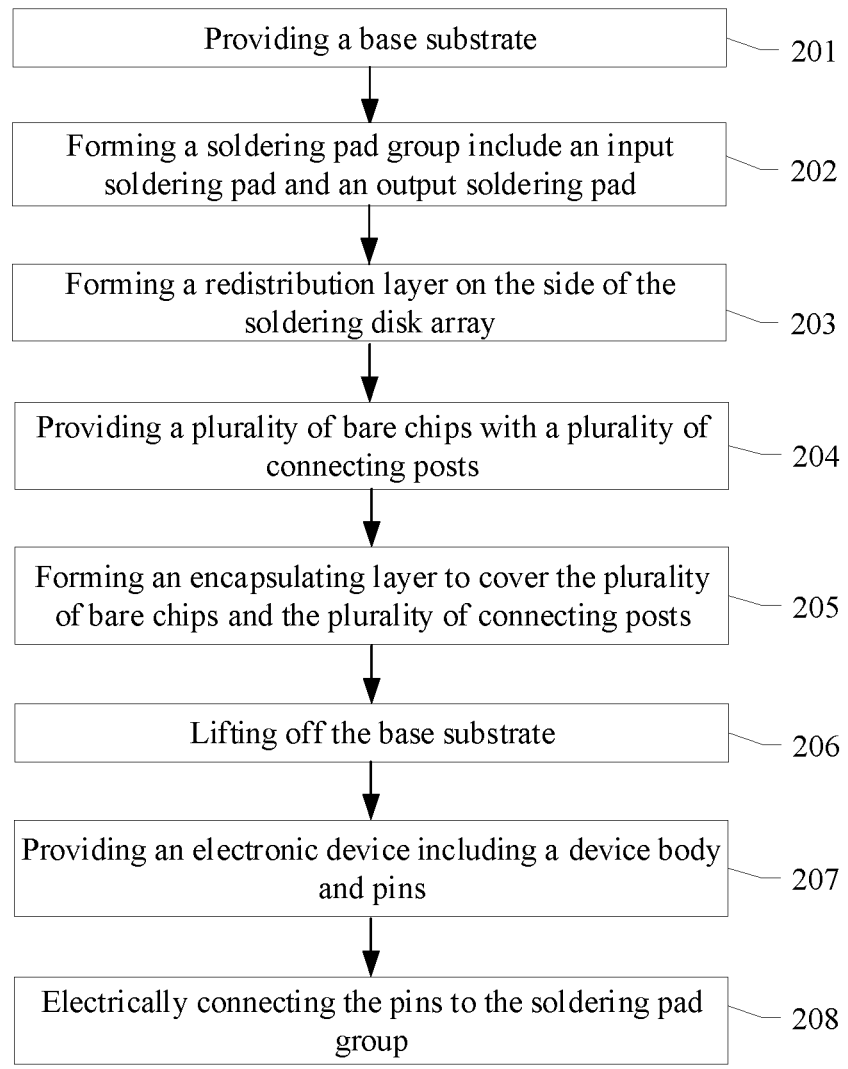
FIG. 36 illustrates another exemplary chip package method consistent with various disclosed embodiments in the present disclosure.
Figure 37:
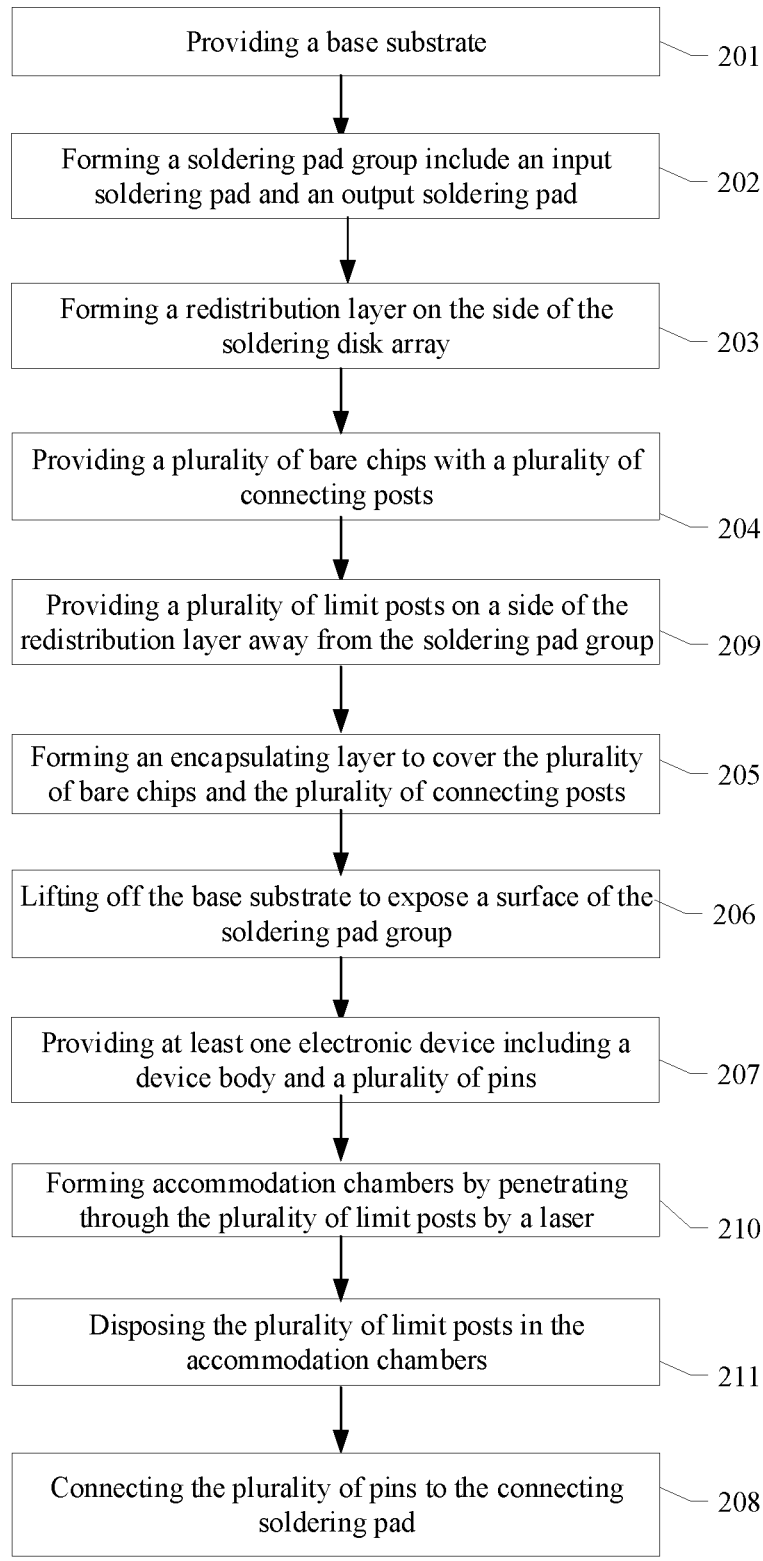
FIG. 37 illustrates another exemplary chip package method consistent with various disclosed embodiments in the present disclosure.

In the present embodiment, since an order for forming film layers may be changed, through holes in FIG. 35 may be formed in an insulating layer between the soldering pad group 30 and the redistribution layer 20 and in an insulating layer between the redistribution layer 20 and the plurality of connecting posts 50, to achieve an electrical connection between the corresponding two film layers. In some other embodiments, through holes in FIG. 2 may be formed to achieve an electrical connection between the corresponding two film layers. The present disclosure has no limit on this.

In one embodiment illustrated in FIGS. 5-6, FIG. 19, and FIG. 36, when forming the soldering pad group 30 in Step 202, the soldering pad group 30 may further include connecting soldering pads 33. After lifting off the base substrate 80 in Step 206, the chip package method may further include:

Step 207: providing at least one electronic device 60 with a device body 61 and a plurality of pins 62 on the device body 61; and Step 208: electrically connecting the plurality of pins 62 to the connecting soldering pads 33.

In the present disclosure, since the soldering pad group 30 and the redistribution layer 20 may be formed before assembling the plurality of bare chips 40, the assembly of the at least one electronic device 60 may be performed after lifting off the base substrate 80. A detailed process for the assembly of the at least one electronic device 60 may be referred to related description in the previous embodiment illustrated in FIG. 18.

In one embodiment illustrated in FIG. 5, FIG. 7, FIGS. 22-24, and FIG. 37, before forming the encapsulating layer 10 in Step 205, the chip package method may further include: Step 209: disposing a plurality of limit posts 12 on a side of the redistribution layer 20 away from the soldering pad group 30. Before electrically connecting the plurality of pins 62 to the connecting soldering pads 33 in Step 208, the chip package method may further include: Step 210: forming accommodating chambers 11 by using a laser to penetrate through the plurality of limit posts 12; and Step 211: disposing the plurality of pins 62 penetrating through the connecting soldering pads 33 in the accommodating chambers 11 after electrically connecting the plurality of pins 62 to the connecting soldering pads 33.

In the present disclosure, the soldering pad group 30 and the redistribution layer 20 may be formed before assembling the plurality of bare chips 40. Since the plurality of limit posts 12 may be formed before forming the encapsulating layer 10, the plurality of limit posts 12 may be formed on an insulating side of the redistribution layer 20 away from the soldering pad group 30. A detailed process for the assembly of the at least one electronic device 60 may be referred to related description in the previous embodiment illustrated in FIG. 20.

In the present disclosure, the plurality of bare chips may be packaged together by a fan-out package method and signals may be transmitted between the plurality of bare chips through the redistribution layer. The redistribution layer may be a single layer structure or a multi-layer structure according to actual needs. A space occupied by the wires may be reduced. Correspondingly, the integration level of the chip package structure may be improved and a power consumption of the electronic products may be reduced. A portion of the connecting posts in the plurality of bare chips for externally connecting signals may be wired out through the soldering pad group, and a remaining portion of the connecting posts in the plurality of bare chips may be connected inside the chip package structure through the third redistribution wire. Correspondingly, a single chip package structure may be used to substitute the current structure where bare chips are packaged independently and then are assembled with the PCB. The chip package structure may be simplified. The formation and application of the chip package structure may be convenient since a ball implanting process may be avoided. A production cost of the electronic products may be reduced, and a good product ratio and a productivity of the electronic products may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A chip package structure, comprising an encapsulating layer, a redistribution layer, a soldering pad group, and a plurality of bare chips, wherein:
   a plurality of connecting posts is formed on a side of the plurality of bare chips;
   the encapsulating layer covers the plurality of bare chips and the plurality of connecting posts, and exposes a side of the plurality of connecting posts away from the plurality of bare chips;
   the redistribution layer is disposed on the side of the plurality of connecting posts away from the plurality of bare chips, the redistribution layer including a first redistribution wire, a second redistribution wire, and a third redistribution wire;
   two bare chips or more than two bare chips of the plurality of bare chips are connected by one or more redistribution wires selected from the second redistribution wire, and the third redistribution wire via corresponding connecting posts of the plurality of connecting posts;
   the soldering pad group is disposed on a side of the redistribution layer away from the encapsulating layer, and includes an input soldering pad and an output soldering pad; and
   the input soldering pad is electrically connected to the first redistribution wire, and the output soldering pad is electrically connected to the second redistribution wire; or the input soldering pad is electrically connected to the second redistribution wire, and the output soldering pad is electrically connected to the first redistribution wire.

2. The structure according to claim 1, wherein:
   the soldering pad group further includes connecting soldering pads electrically connected to the redistribution layer;
   the chip package structure further includes at least one electronic device;
   the at least one electronic device includes a device body and a plurality of pins; and
   the plurality of pins is electrically connected to the connecting soldering pads.

3. The structure according to claim 2, wherein:
   the encapsulating layer includes a plurality of accommodation chamber; and
   the plurality of pins is disposed in the plurality of accommodation chambers after penetrating through the connecting soldering pads.

4. The structure according to claim 3, wherein:
   a side surface of the encapsulating layer away from the redistribution layer is a first surface; and
   along a direction perpendicular to a plane of the plurality of bare chips, a distance h between the plurality of accommodation chambers and the first surface is larger than or equal to 0.

5. The structure according to claim 2, wherein:
   the plurality of pins is electrically connected to the connecting soldering pads through solders.

6. The structure according to claim 2, wherein:
   the at least one electronic device is any one of a resistor, a capacitor, an inductor, and a diode.

7. The structure according to claim 1, further including a protective layer;
   wherein:
   the protective layer is disposed on the side of the encapsulating layer away from the redistribution layer and on a side of the plurality of bare chips away from the redistribution layer.

8. The structure according to claim 7, further including a flexible substrate on a side of the protective layer away from the redistribution layer.

9. The structure according to claim 1, wherein:
   the plurality of bare chips includes at least one first bare chip and at least one second bare chip;
   along the direction perpendicular to a plane of the plurality of bare chips, a height d1 of the at least one first bare chip is different from a height d2 of the at least one second bare chip;
   the plurality of connecting posts includes first connecting posts on a side of the at least one first bare chip and second connecting posts on a side of the at least one second bare chip; and
   a side surface of the first connecting posts close to the redistribution layer is flush with a side surface of the second connecting posts close to the redistribution layer.

10. The structure according to claim 9, wherein:
    along the direction perpendicular to a plane of the plurality of bare chips, a height of the first connecting posts is same as a height of the second connecting posts.

11. A chip package method, comprising:
    providing a base substrate;
    providing a plurality of bare chips attached to the base substrate and forming a plurality of connecting posts on a side of the plurality of bare chips;
    forming an encapsulating layer to cover the plurality of bare chips and the plurality of connecting posts;
    polishing the encapsulating layer to expose a side of the plurality of connecting posts away from the plurality of bare chips;
    forming a redistribution layer on the side of the plurality of connecting posts away from the plurality of bare chips, including a first redistribution wire, a second redistribution wire, and a third redistribution wire, wherein two bare chips or more than two bare chips of the plurality of bare chips are connected by one or more redistribution wires selected from the second redistribution wire, and the third redistribution wire via corresponding connecting posts of the plurality of connecting posts;
    forming a soldering pad group on a side of the redistribution layer away from the encapsulating layer, including an input soldering pad and an output soldering pad; wherein the input soldering pad is electrically connected to the first redistribution wire, and the output soldering pad is electrically connected to the second redistribution wire; or the input soldering pad is electrically connected to the second redistribution wire, and the output soldering pad is electrically connected to the first redistribution wire; and
    lifting off the base substrate.

12. The method according to claim 11, wherein:
    the soldering pad group further includes connecting soldering pads; and
    before or after lifting off the base substrate, the method further includes: providing at least one electronic device including a device body and a plurality of pins; and electrically connecting the plurality of pins to the connecting soldering pads.

13. The method according to claim 12, wherein:
    before forming the encapsulating layer, the method further includes forming a plurality of limit posts on the base substrate; and before electrically connecting the plurality of pins to the connecting soldering pads, the method further includes:
forming accommodation chambers by using a laser to penetrate through the plurality of limit posts; and
disposing the plurality of pins in the accommodation chambers after the plurality of pins penetrates through the connecting soldering pads.

14. The method according to claim 12, wherein:
the plurality of pins is electrically connected to the connecting soldering pads by a soldering method.

15. The method according to claim 11, after lifting off the base substrate, further including forming a protective layer on the side of the encapsulating layer away from the redistribution layer and on a side of the plurality of bare chips away from the redistribution layer.

16. The method according to claim 11, wherein:
before providing the plurality of bare chips, a flexible substrate is formed on the base substrate and a protective layer is formed on the flexible substrate; and
after providing the plurality of bare chips, the plurality of bare chips is attached to the protective layer.

17. A chip package method, comprising:
providing a base substrate;
forming a soldering pad group on the base substrate including an input soldering pad and an output soldering pad;
forming a redistribution layer on a side of the soldering pad group away from the base substrate, including a first redistribution wire, a second redistribution wire, and a third redistribution wire, wherein the input soldering pad is electrically connected to the first redistribution wire, and the output soldering pad is electrically connected to the second redistribution wire; or the input soldering pad is electrically connected to the second redistribution wire, and the output soldering pad is electrically connected to the first redistribution wire;
providing a plurality of bare chips and a plurality of connecting posts on a side of the plurality of bare chips, wherein two bare chips or more than two bare chips of the plurality of bare chips are connected by one or more redistribution wires selected from the second redistribution wire, and the third redistribution wire via corresponding connecting posts of the plurality of connecting posts;
forming an encapsulating layer to cover the plurality of bare chips and the plurality of connecting posts; and
lifting off the base substrate to expose a surface of the soldering pad group.

18. The method according to claim 17, wherein:
the soldering pad group further includes connecting soldering pads; and
after lifting off the base substrate, the method further includes: providing at least one electronic device including a device body and a plurality of pins; and electrically connecting the plurality of pins to the connecting soldering pads.

19. The method according to claim 18, wherein:
before forming the encapsulating layer, the method further includes forming a plurality of limit posts on a side of the redistribution layer away from the soldering pad group; and
before electrically connecting the plurality of pins to the connecting soldering pad, the method further includes:
forming accommodation chambers by using a laser to penetrate through the plurality of limit posts; and
disposing the plurality of pins in the accommodation chambers after the plurality of pins penetrates through the connecting soldering pads.

* * * * *